(12) United States Patent
Frishberg et al.

(10) Patent No.: US 7,827,209 B2
(45) Date of Patent: Nov. 2, 2010

(54) DATA OBJECT BASED DATA ANALYSIS

(75) Inventors: Leo David Frishberg, Portland, OR (US); Eric Gould Bear, Austin, TX (US)

(73) Assignee: Tektronix, Inc., Beaverton, OR (US)

( * ) Notice: Subject to any disclaimer, the term of this patent is extended or adjusted under 35 U.S.C. 154(b) by 344 days.

(21) Appl. No.: 11/862,830

(22) Filed: Sep. 27, 2007

(65) Prior Publication Data

US 2009/0043803 A1 Feb. 12, 2009

Related U.S. Application Data

(60) Provisional application No. 60/954,873, filed on Aug. 9, 2007.

(51) Int. Cl.
*G06F 7/00* (2006.01)
*G06F 17/30* (2006.01)

(52) U.S. Cl. ..................................... 707/802

(58) Field of Classification Search ............... None
See application file for complete search history.

(56) References Cited

U.S. PATENT DOCUMENTS

| | | | |
|---|---|---|---|
| 6,041,267 A * | 3/2000 | Dangat et al. | 700/107 |
| 6,690,398 B1 | 2/2004 | Beck et al. | |
| 2004/0125139 A1 | 7/2004 | Beck et al. | |
| 2006/0117067 A1* | 6/2006 | Wright et al. | 707/104.1 |
| 2009/0007223 A1* | 1/2009 | Centonze et al. | 726/1 |

* cited by examiner

*Primary Examiner*—Uyen T. Le
(74) *Attorney, Agent, or Firm*—Derek Meeker; Thomas F. Lenihan

(57) ABSTRACT

A test and measurement instrument and method of operating for presenting data in a data presentation, receiving a data selection indicating a portion of the data presented in the data presentation, generating a data object in response to the data selection, presenting the data object in an analysis sandbox, and generating an analysis construct in response to analysis objects in the analysis sandbox.

24 Claims, 16 Drawing Sheets

DATA OBJECT BASED DATA ANALYSIS

CROSS REFERENCE TO RELATED APPLICATIONS

This application claims priority under 35 U.S.C. §119(e) from U.S. Provisional Application Ser. No. 60/954,873, filed on Aug. 9, 2007, the contents of which are herein incorporated by reference in their entirety.

BACKGROUND

This disclosure relates to test and measurement instruments and in particular to test and measurement instruments for analyzing data.

Users of test and measurement instruments typically analyze data using several techniques such as triggering, filtering, searching, and annotating. Some test and measurement instruments offer a drag and drop interface to select a condition for analysis within the context of constructing a trigger. For example, a user may drop in a trigger condition, but then the user must fill in the signals and criteria for the condition.

In general, the creation of constructs to analyze data is performed in isolation from the data. For example, a trigger can be established such that a user is expected to enter a particular value in the data. Once that value has been entered, some action can be taken to analyze the data. However, the user is required to take the value out of the context of the data and add it into the context of the trigger.

In addition, interfaces for each of the various data analysis techniques can require the user to operate in a context different for each technique. Accordingly, a user must become familiar with multiple contexts when using different data analysis techniques on the same data. Some analysis contexts can have common elements between the respective interfaces; however no universal context has been created for filtering, searching, annotating, and triggering.

Furthermore, with respect to multi-module environments, trigger constructs may be limited to an individual module. A trigger construct may not be able to utilize conditions from multiple modules. Thus, a trigger may be limited in its ability to take advantage of conditions or occurrences that cross module boundaries.

In one test and measurement instrument, a user can draw a box around a portion of data. The selected data is used to generate a trigger construct. However, the user cannot manipulate the data used, add additional data, add functionality, or the like to the generated construct.

Some programming interfaces allow the user to graphically define code. One interface allows a user to drag and drop graphical representations of functional blocks to create a software program. For example, a user can place predefined functional blocks linked according to process flow. The blocks can be rendered to reflect the type of function. For example, an if-then function can be represented as a two prong branching block. However, the functional blocks are used outside of the context of the data acquired in a test and measurement system.

Accordingly, there remains a need for a test and measurement instrument with improved data analysis.

SUMMARY

An embodiment includes a test and measurement instrument and method of operating for presenting data in a data presentation, receiving a data selection indicating a portion of the data presented in the data presentation, generating a data object in response to the data selection, presenting the data object in an analysis sandbox, and generating an analysis construct in response to analysis objects in the analysis sandbox.

DETAILED DESCRIPTION

Figure 1:
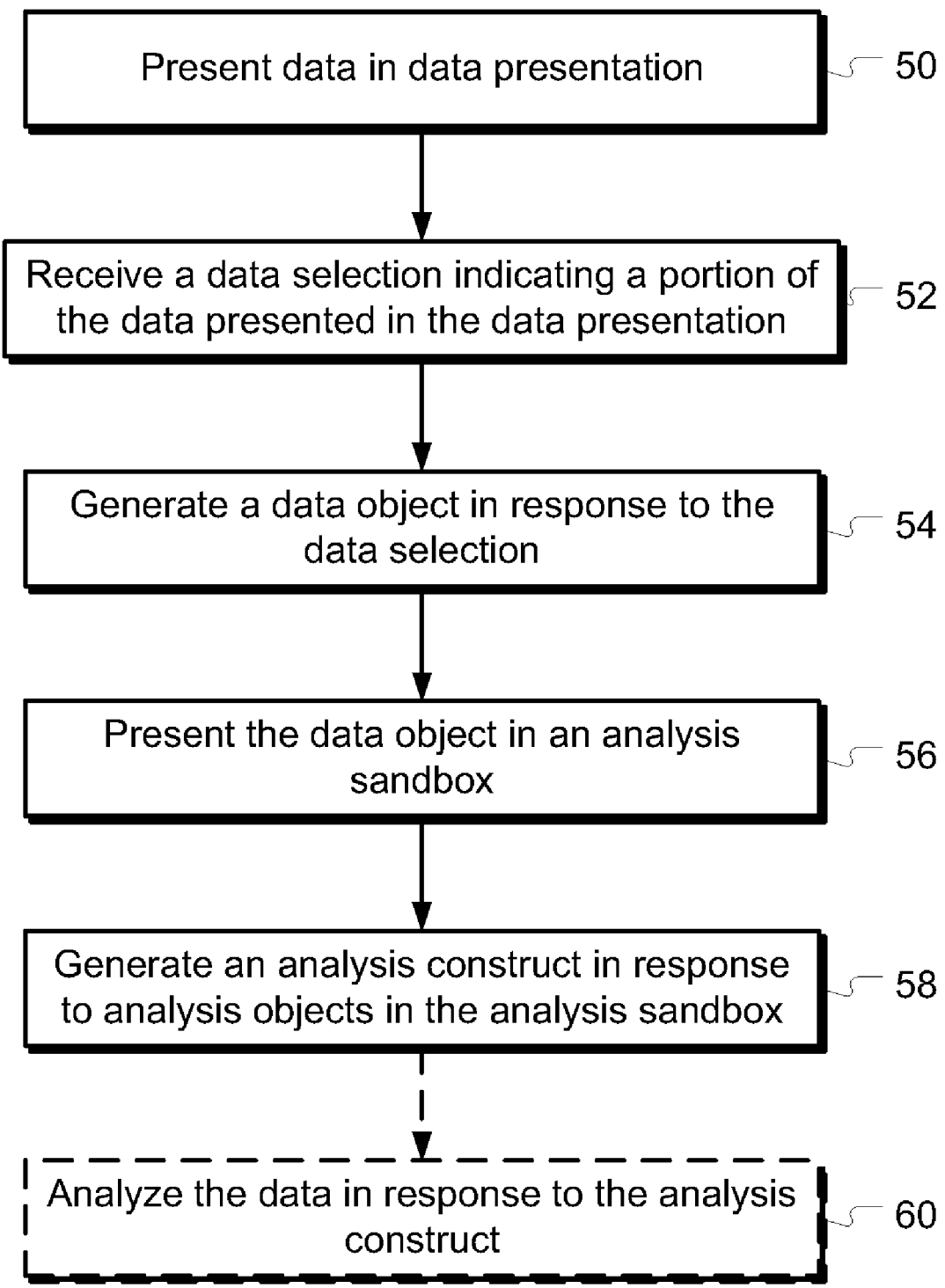
FIG. 1 is a flowchart illustrating a method of analyzing data according to an embodiment of the invention.

Embodiments will be described with reference to the drawings. Embodiments include data analysis based on data objects generated from acquired data. As a result, a user's focus can remain on the data rather than particular forms, languages, interfaces, or the like associated with any one data analysis technique used to interpret the data.

Users analyze data to detect errors, verify performance, or the like. To perform such tasks, a user can be interested in patterns within the data. Such patterns can be errors, anomalies, or other events of interest. For example, a user may be examining data that represents a series of transactions between devices on a PCI Express bus. The PCI Express standard defines proper handshaking, link training, formatting, or the like for the transactions. The user can be interested in the patterns in the data forming or not forming. As a result, the user can focus on these patterns to identify potential problems or to evaluate the system.

Data analysis is the technique of examining the data for events of interest. As described above, a particular set of data may interest a user. The user wants to find this set of data. However, this data can be one instance in a huge collection of data. Instead of manually searching for the data, a user can define actions to aid in identifying such data, for example, by a test and measurement instrument. These actions are collectively called data analysis. There are four particular examples of data analysis that users of test and measurement instruments rely upon. These examples are filtering, triggering, searching and annotation.

Filtering includes removing data from a data set to improve visibility of the remaining data. For example, some data can be identified from the entire set of the data. The identified data can be used to present a particular set of the data. Data other than the identified data can be removed, focusing the user's attention on the identified data. In this example, the identified data is the data of interest. In another example, the identified data can be the data that is not of interest. The identified data could be the error free data, while the remaining data has errors. Through filtering, the user can remove the error free data and focus on the errored data. In another example, data offset from the identified data can be the interesting data. Although particular examples of the interesting data have been described with reference to the identified data, the data that is filtered out can be based on any number of conditions relative to the identified data.

Triggering includes causing an action to take place on the occurrence of a particular condition at the time of data acquisition. The action can include starting acquisition, stopping acquisition, storing data or the like. Just as in filtering, the condition can be a pattern in the data. For example, when a sequence of data including an error occurs, data surrounding that occurrence can be stored for examination.

Searching includes moving a user's focus within a previously acquired data set. A pattern of data is defined and the data is searched for that pattern. For example, a user may be interested in a glitch on a particular signal. The user can search for the glitch. In response, the presentation of the data representing the signal is adjusted such that the glitch is presented. In this example, the indicated data is the glitch.

Annotation includes changing the presentation of the data. For example, annotation can include placing a mark within the acquired data set that defines a condition of interest. Marking is the identification of an event, occurrence, condition, pattern, or the like in the data. Note that, in contrast to searching, the focus need not change to the identified data. The identification is the association of the data with a presented mark, a stored reference for later retrieval, an annotation of the data, or any other modification Although filtering, triggering, searching, and annotation have been described along with particular examples, data analysis is not limited to the particular examples, nor to the categories of filtering, triggering, searching, and annotation. Data analysis includes any action taken in response to an occurrence of a data event. Furthermore, any data analysis can be performed substantially simultaneously as other data analyses. For example, a trigger analysis construct can indicate whether to store data and a filter analysis construct can identify particular patterns in the data and present the results as the data is being acquired.

FIG. 1 is a flowchart illustrating a method of analyzing data according to an embodiment of the invention. The method includes presenting data in a data presentation in 50, receiving a data selection indicating a portion of the data presented in the data presentation in 52, generating a data object in response to the data selection in 54, presenting the data object in an analysis sandbox in 56, and generating an analysis construct in response to analysis objects in the analysis sandbox in 58.

A data presentation is a representation of the data. The data presentation is what conveys the information embodied in the data to a user. The data presentation can take a variety of forms. For example, the data presentation can be a visual presentation. Data is commonly represented visually. Analog data, such as an analog voltage, can be represented by a varying line on a graph, where one axis represents voltage and a second axis represents time. Digital data can be represented by a series of numbers. Packetized data can be represented by a box for a field defined by a protocol with a value associated with that field.

The data presentation need not be a visual presentation. In another example, data can also be in an audible format. A musical instrument can make sounds. These sounds can be the data. Accordingly, the data presentation can be an audible data presentation. When presented in an audible data presentation, the sounds can be recreated. The recreation of the sounds is the data presentation. Furthermore, the data represented by the sounds need not have been acquired as a sound. For example, the reception of a data packet over an optical communications link can be represented by an audible sound. Thus, the frequency of the data packets can be communicated to a user through the frequency of the sound.

In another example, the data presentation can be a tactile data presentation. A tactile data presentation can present data through vibrations, movement, or the like using the sense of touch. Similar to other data presentations, the tactile data presentation can, but need not be limited to representing phenomenon sensed by touch.

Furthermore, a data presentation can be a combination of such different types of data presentations. For example, a data presentation can have both audible and visual aspects. Accordingly, presenting the data in a data presentation in 50 can include any such type, format, sense, or the like. In a specific example, a data presentation can include a visual display of digital data on a screen of a logic analyzer.

Once data is presented in a data presentation, a user can interact with the data presentation. For example, the user can select portions of the data in the data presentation. If the data presentation is a visual presentation, the user can draw a selection box around particular portion. The data selection can indicate the portion in other ways. Presented data may have a handle or other identifier identifying a particular set of the data. For example, several signals may be displayed at once with each signal associated with a handle. Selecting a handle can be a data selection.

In another example, measurements, data analysis, or the like may have placed marks or other identifiers on the data. The data selection can indicate these marks to select the data associated with the marks. Any variety of selection of the data in the data presentation can be used. As a result, a data selection is received indicating a portion of the data presented in the data presentation in 52.

Receiving the data selection can be accomplished in a variety of ways. For example, since data is presented in the data presentation, receiving the data selection can be receiving an input through an interface for manipulating the data presentation. Accordingly, receiving the data selection can include receiving a user input drawing a box around the data, receiving a click on the data, or the like. In addition, receiving the data selection can include receiving an event indicating that a key, button, knob, or the like that corresponds to the data has been manipulated. Regardless of the source or technique of communication, the data selection indicates a portion of the data presented in the data presentation.

In 54, a data object is generated in response to the data selection. A data object is a representation of a set of data. As described above, data can be selected. In an embodiment, the data object can include the data itself. For example, if the data object represents a time span of an analog signal, the data object can include the captured data representing the analog signal over that time span. In another example, if the data is digital data on a bus, the data object can include the digital data.

The data object can also be an abstraction of the source data. Thus, the data object need not contain the source data as acquired, but can contain a processed version of that data. Using the analog signal described above, signal levels, rise times, jitter relative to a trigger, periods, pulse widths, packet header values, or the like can be included in the data object. Furthermore, the data object can include more than one representation of the data. For example, a packet header can also be accompanied by other abstractions such as rise and fall times for the signals embodying the packet header. The data object is not limited to any one particular type of representation. In particular, the data object can, but need not be limited to an object-oriented data object as used in various programming techniques.

A data presentation can be the result of previous data analysis. In one example, the data presentation can be a filtered data presentation. As a result, when data is selected from that presentation, the resulting data object can contain the filtering parameters used to generate the presented data. For example, a user may filter the data according to packet header values. As a result, the displayed packets may be only the packets with the desired packet header values. When a user selects one or more of these packets from the filtered presentation, the user can be implicitly indicating that the existing filtering that created the presentation is part of the characteristics of the selected data. Thus, the resulting data object can include the filter parameters.

Although the selected data can already include the inherent characteristics of the filter, i.e. the packet value in the example above, other parameters may have contributed to the presentation of that filtered data that are not inherent in the data. For example, the filter may pass a number of packets following a particular packet having the matching header value. The additional passed packets may not inherently include the value of the first packet header. Thus, if just using the inherent characteristics of the selected data, the filter attribute of the particular sequence may be lost. Accordingly, the selection of the data can include the filtering characteristics that resulted in the data presentation as well.

In 56, the data object is presented in an analysis sandbox. An analysis sandbox is a portion of a user interface for creating an analysis construct. Data objects, meta-symbols, values, constants, or the like within the analysis sandbox can be used in creating the analysis construct. The various objects in the analysis sandbox can be oriented relative to one another, associated with one another, or the like.

In an embodiment, the analysis sandbox is presented on the same display as the data presentation. The data object is displayed in the analysis sandbox. For example, the data presentation can be in a window of a display such as a screen of a logic analyzer. The analysis sandbox can be another window on the same screen. In another example, the analysis sandbox can be part of the data presentation itself. That is, the analysis sandbox can occupy the same area as the data presentation.

The presentation of the data objects in the analysis sandbox can, but need not be the same as the data presentation. For example, the analysis sandbox and the data presentation can be on separate displays. The analysis sandbox and the data presentation can also be in different formats. For example, the analysis sandbox can be a visual presentation and the data presentation can be an audible presentation.

Through receiving a data selection in 52, generating a data object in 54, and presenting the data object in the analysis sandbox in 56, the data objects are added to the analysis sandbox. Once data objects are added to the analysis sandbox, those data objects can be used to generate an analysis construct in 58. The analysis construct is generated in response to analysis objects in the analysis sandbox.

An analysis construct is a representation of one or more actions for the data analysis. As described above, actions are performed for data analysis. The analysis construct can include functions, data objects, data sources, module identifications, constants, variables, instructions, operations, conditions, or the like to accomplish the desired data analysis. For example, an analysis construct can include a trigger function such as storing data from an analog signal when the analog signal crosses a threshold.

In an embodiment, the analysis sandbox allows a user to create a graphical representation to generate an analysis construct. The user can select data from a data presentation and add it to the analysis sandbox. Once in the analysis sandbox, the user can add meta-symbols, parameterize the symbols, and generate a resulting analysis construct. The analysis construct can subsequently be used for a trigger. All of this can be done from an arbitrary pattern of data.

In addition, the analysis sandbox presents a common interface to data analysis. For example, the analysis sandbox creates a unique method of standardizing definitions for triggering, filtering, searching, and annotation, and other data analysis.

Figure 2:
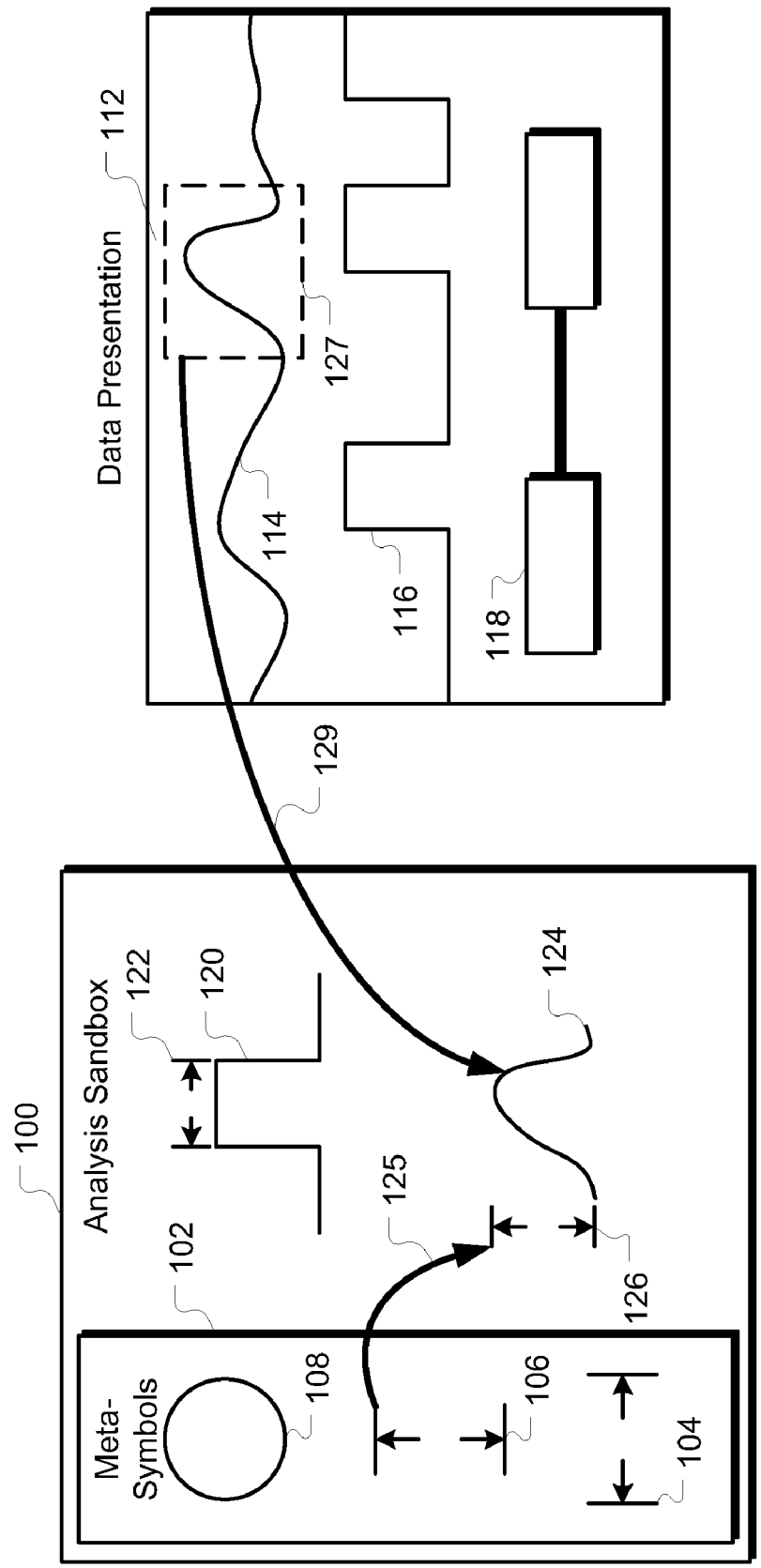
FIG. 2 is a diagram illustrating an example of a user interaction with a data presentation and an analysis sandbox.

FIG. 2 is a diagram illustrating an example of a user interaction with a data presentation and an analysis sandbox. FIG. 2 includes examples of an analysis sandbox 100 and a data presentation 112. In the data presentation 112, three sets of data are presented. Analog signal 114, digital signal 116, and symbolic representation 118 are all presented in the data representation 112. Not only can data from a variety of sources be presented in the data presentation 112, the data presentation 112 can present the same data in a variety of formats. For example, the analog signal 114 can be the signal that results in the digital data 116, which in turn generates packet data represented by the symbolic representation 118.

The analysis sandbox 100 is the interface that allows a user to create an analysis construct. In this example, the analysis sandbox 100 includes a meta-symbol frame 102. Meta-symbols are symbols that represent how data objects contribute to an analysis construct. In one example, a meta-symbol can represent a duration of time. The time symbol 104 is an example of such a meta-symbol. The meta-symbol can be a line with two endpoints representing a time. Thus, the meta-symbol can indicate that a duration of time is used in the data analysis. In another example, the symbol can be an amplitude analysis. The amplitude symbol 104 indicates that an amplitude of a parameter is to be analyzed.

A meta-symbol can be a representation of an operation. For example, the meta-symbols can be an operation performed on a data object. The data object can be a parameter of the meta-symbol. Examples of functions include loops, branches, counting skipping, waiting, storing, arming, or the like. For example, a meta-symbol for a loop can repeat until a particular condition is met in the data a number of times. The meta-symbol can be a shape surrounding a data object indicating that instances of data events represented by data object in the data should be counted. The count symbol 108 indicates that a particular parameter is to be counted.

In another example, the meta-symbol can represent a control. The meta-symbol can be a branch symbol with two arrows indicating what happens according to the condition of the branch.

Although particular examples of what a meta-symbol can represent have been given, the meta-symbols can represent any variety of interactions, usages, or the like of data objects. Furthermore, uses of a meta-symbol are not limited to a measurement, function, or control as described above. A meta-symbol can include any operation for an analysis construct, including operations independent of the data. For example, a meta-symbol can represent calling a user defined function, requesting a user input, or the like. Any functionality can be exposed to the user through a meta-symbol beyond manipulation, use, or reaction to the data.

A meta-symbol parameter is a configurable aspect of a meta-symbol. Any parameter of a function associated with a meta-symbol can have an associated meta-symbol parameter in the meta-symbol. For example, a loop meta-symbol can have a condition parameter to identify whether the loop should continue. The condition parameter is a meta-symbol parameter. The meta-symbol for a branch can change the process flow based on a data object. A meta-symbol can also be a parameter of another meta-symbol. For example, a first meta-symbol can include a loop function. A second meta-symbol can be used to determine whether the loop should continue. The second meta-symbol can be a counting function. Thus, some event is counted by the second meta-symbol. Based on the count, the first meta-symbol continues or terminates the loop.

In addition, meta-symbols can also use other data as parameters. For example, constants, user input values, or the like can be parameters of a meta-symbol. Any information can be a parameter of a meta-symbol.

A count symbol 108, an amplitude symbol 106, and a time symbol 104 are examples of particular meta-symbols in the meta-symbol frame 102. The functionality implemented by these examples need not be limited to the functionality described, nor must that particular functionality be associated with that particular meta-symbol. For example, the circular shape of count symbol 108 can represent a state of a data object rather than indicating that the particular data object is to be counted. Furthermore, the meta-symbol frame 102 is one example of how the meta-symbols can be available to a user. A meta-symbol frame 102 need not be used.

Data objects and meta-symbols have been described above with various features, being combined with each other, and the like. Such objects and symbols will be referred to commonly as analysis objects as some interactions with analysis objects apply both to data objects and meta-symbols. Thus, an analysis object can be a data object, a meta-symbol, a combination of any number of data objects and/or meta-symbols, or the like.

Referring back to FIG. 2, a data selection 127 was made on the data presentation 112. A data object 124 was generated from the selection 127. Arrow 129 indicates a drag-and-drop operation where the portion of the analog signal 114 was selected and dragged to the analysis sandbox 100. As a result, an analysis construct can be created using the selected portion of the data though the data object 124. It should be noted that the arrow 129 and other arrows used herein are not limited to drag-and-drop operations. The arrows are used to indicate some form of selection. For example, as described above, a data selection can be input in a variety of ways with a drag-and-drop operation being one of the ways.

Data object 124 has an amplitude meta-symbol 126 associated with it. Arrow 125 indicates a selection for a meta-symbol for the data object 124. In one example, the amplitude meta-symbol 126 can indicate that in forming the analysis construct, the parameter of the selected data used for the analysis construct is the amplitude of the data. For example, when generating a trigger analysis construct, the trigger can be responsive to the amplitude of the data, i.e. whether that amplitude passes a threshold. When analyzing portions of the analog signal 114 described above, the amplitude can be measured. Any operation using the amplitude of the data object or the signal represented by the data object can be used.

Analysis sandbox 100 includes another data object 120. In this example, data object 120 was selected from a digital signal 116 in data presentation 112. For data object 120, a time meta-symbol 104 was added as time meta-symbol 122. Time meta-symbol 122 measures a pulse width of the data object 120.

Although an example has been described of a meta-symbol being associated with a data object in response to a selection, in another example, the meta-symbol can be associated with the data object without user intervention. The nature of the data object, the position of the data object in the analysis sandbox, or any other aspect of the data object can result in a meta-symbol being associated automatically. For example, placing data objects next to each other can indicate that the user wants to use the time between the data objects in the resulting analysis construct. Thus a time meta-symbol can be automatically associated with the data objects. In another example, if a second data object is placed below a first data object, a count meta-symbol can be added indicating that occurrences between the two data objects should be counted.

Referring back to FIG. 1, in 60, the data can be analyzed in response to the analysis construct. For example, the data can be filtered, searched, triggered, annotated, or the like in response to the analysis construct. With the analysis sandbox 100, the user can use data from a data presentation, manipulate it, then proceed to analyze the data Although the analysis construct has been described in relation to data from a data presentation, it can be used in later data analysis. In an embodiment, the analysis construct formed in the analysis sandbox can be edited, saved, re-used with other data acquisitions, re-used as sub-routines in new definitions, or the like. For example, an acquisition can be taken and a trigger analysis construct can be generated. Using the trigger analysis construct, a subsequent acquisition can be triggered. Thus, analyzing the data in 60 can be data that is subsequently acquired relative to the creation of the analysis construct.

The data from the original data presentation used to generate a data object can, but need not remain a part of the analysis construct or part of the data object. For example, consider a pulse with a width less than a particular value. That pulse was selected by the user for the analysis sandbox to generate an analysis construct. From the pulse, a data object can be created with a data event representing the pulse width but not including the original data source. In another example, if the data object is a particular packet header, the user may not want to limit the analysis to the same signal, but may want to analyze similar packet headers regardless of the data source. Accordingly, for present or subsequent data analysis, any aspect of a data object, a meta-symbol, or the like can be included or excluded.

Figure 3:
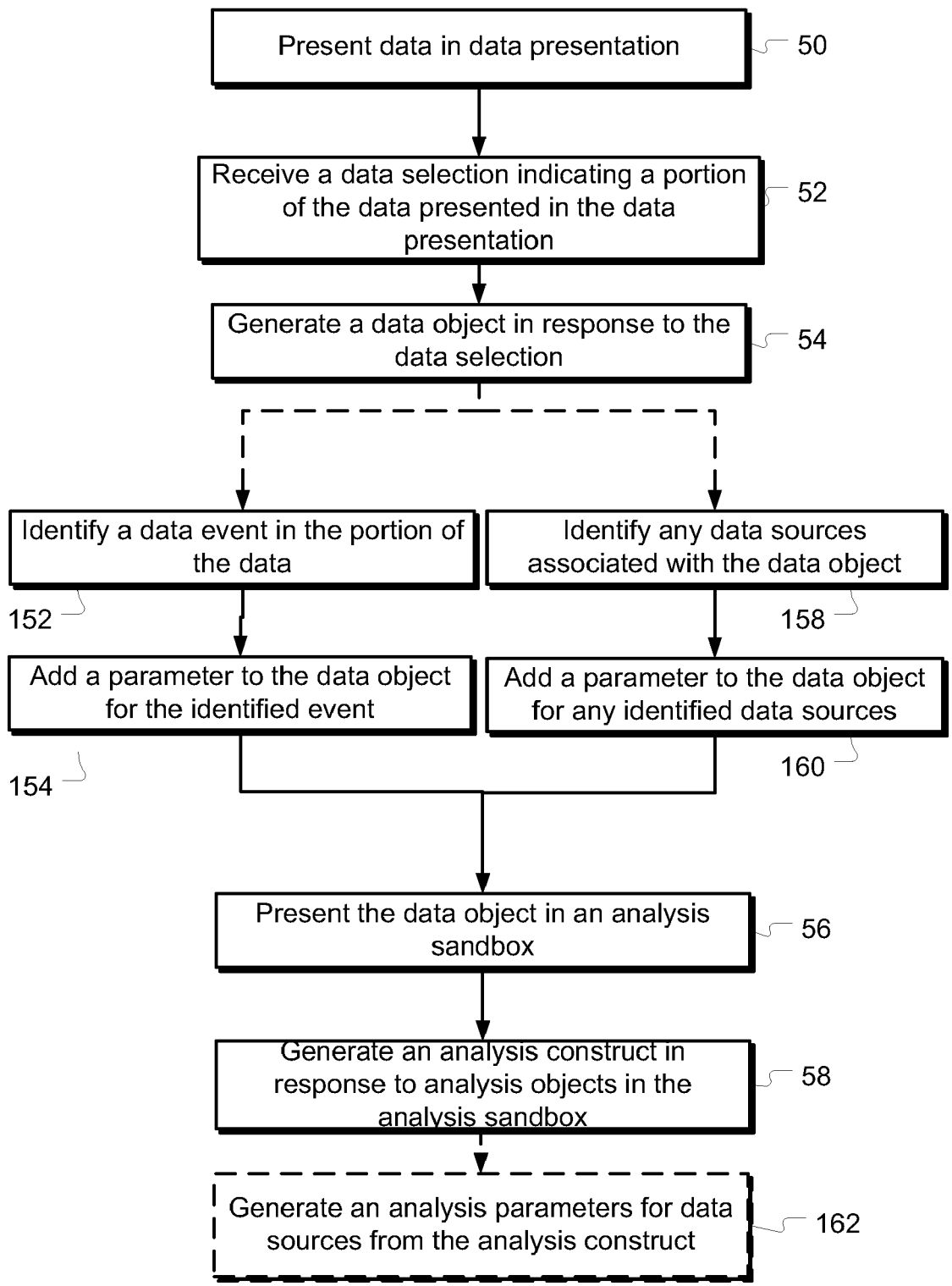
FIG. 3 is a flowchart illustrating how parameters of a data object are added in the method of analyzing data of FIG. 1.

FIG. 3 is a flowchart illustrating how parameters of a data object are added in the method of analyzing data of FIG. 1. In an embodiment, a data event can be identified in 152 from the portion of the data used to generate the data object. A data event is a characterization of data. For example, a data event can be an edge of an analog signal, an encoded value on a bus, a failed CRC in a packet, or any other definable condition in the data, missing from the data, partially satisfied in the data, or the like.

A data event is not limited to any particular representation of the data. For example, a final representation of the data can be a value. However, intermediate representations such as digital states of lines of a bus over which the value was transmitted, analog signals on those lines, or the like can also be data events. Any characterization of the data can be a data event regardless of its presentation.

A data event need not be limited to one set of data. For example, a single data event can include a relationship of a data event in a first set of data and a data event in a second set of data. For example, the individual data events can be a rising edge on a probed clock signal and a tone in an audio signal. The resulting data event can be an occurrence, frequency, duration, or the like of the tone when the rising edge occurs.

Accordingly, identifying the data event in 152 can include identifying any variety of events in the data. For example, a large variety of measurements are available for analog data. An analog signal can be measured for an amplitude, a period, a frequency, a rise time, delay, or the like. These measurements can be performed on the portion of the data associated with the data object. Accordingly, from these measurements, data events can be identified.

All such measurements need not be performed. For example, a user may configure a test and measurement instrument to only generate data events for rise times and pulse widths from a portion of the data. Accordingly, the identified data events are only those of rise times and pulse widths. Furthermore, measurements with respect to analog signals have been described as an example. Any type of measurement can be performed that is appropriate to a particular signal, data representation, medium or the like.

Once a data event is identified from the portion of the data in 152, that data event can be used to add a data object parameter to the data object in 154. A data object parameter is a parameter related to an aspect of the data represented by the data object. Once the data event has been identified, that data event can be represented by parameters. Other attributes beyond a data event can be a parameter. Data source, data type, data presentation, or the like can be parameters of the data object.

Once represented as parameters, the data object can be manipulated to represent other different sets of data. For example, a data object may be created by selecting a rising edge of an analog signal in a data presentation. The rising edge is identified as a data event. In this example, the rise time can be set as a data object parameter. The data object can be modified by changing the parameterized rise time. As a result, a data object can be created having parameters that do not exist in the presented data.

Accordingly, a user need not find the exact condition of interest. For example, a user may be searching for a glitch or a pulse having a width less than a desired amount. If no such pulse is presented, the user can select an existing pulse, modify the parameters of the data object to indicate a pulse with a width of the expected glitch, then use that modified data object to analyze the data. Conceptually, the user can think, "That is the shape I am interested in," and select the data. Then the user can think, "However, what I really want is slightly different," and modify the data object. As a result, the user can generate data objects using the context of the data; the user's attention can remain focused on the data and need not change to a language, interface, or the like particular to a type of data analysis and foreign to the data presentation.

A data source is a device, system, process, or the like that generates data. For example, a data source can include a module in a logic analyzer mainframe. Another example is an oscilloscope system with multiple modules. Another example is a data acquisition process operating on a general purpose computer. Another example is a stored data file, regardless of whether it was generated from acquired data or not. A particular test setup for testing a device under test (DUT) may include multiple modules, instruments, or the like, each potentially having multiple channels, probes, or the like, each being examples of data sources. Data from any of these data sources can contribute to the data presented in 50. Accordingly, when the data selection in 52 indicating a portion of the data is used to generate a data object, that portion of the presentation of the data may be the result of multiple data sources.

Any data sources associated with the data object can be identified in 158. The identification of the sources can be performed in a variety of ways. For example, the data sources can already be associated with the data presented. Thus, during selection of data, the data sources can be extracted. Alternatively, the instruments, modules, or the like can be queried to determine the source of the portion of the data.

Regardless of how they are identified, once the data sources are identified, a parameter can be added to the data object for any identified data sources in 160. As a result, in 158, if an analysis construct is generated using the data object, the particular data sources can be used for the data analysis rather than the entire set of the data.

Once the analysis construct is generated, it can be used to generate analysis parameters. In an embodiment, analysis parameters for data sources from the analysis construct can be generated in 162. As described above, the data can be acquired from multiple data sources. Each of these sources can have particular instructions, commands, controls, attributes, or the like for data analysis. For example, setup for a trigger may be configured differently from one data source to another.

For example, the analysis construct can be used for a trigger after a rising edge on a first data source is followed by a pulse on a second data source. In this example, what interests the user are the edges, the pulses, or other attributes of the data. The user may not be interested in the particular instructions, techniques, instruction sets, constructs, or the like of the first and second data sources for configuring the triggers. Accordingly, the instructions for the first data source for triggering on the rising edge can be generated particular to the first data source. Similarly, the instructions for the second data source for triggering on the pulse can be generated particular to the second data source.

Although it has been described that a user need not be concerned with the particulars of the analysis parameters of data sources, these analysis parameters can be added to a data object as data object or meta-symbol parameter. Thus, a user can examine, edit, or otherwise manipulate the analysis parameters that may be generated from the analysis construct. For example, as described above, a rising edge can be used as a trigger. However, a given data source may have multiple techniques of triggering on a rising edge. When generated, the data object can have analysis parameters initialized to indicate one particular technique of triggering. However, the user can modify the associated data parameter to use a different technique of triggering. Any level of granularity of the data sources can be exposed to the user through the data object. Although a trigger technique has been described as an example of data analysis with varying levels of granularity, any data analysis can have such granularity. In addition, although analysis parameters for multiple data sources have been described, the analysis parameters can be limited to only one data source.

Figure 4:
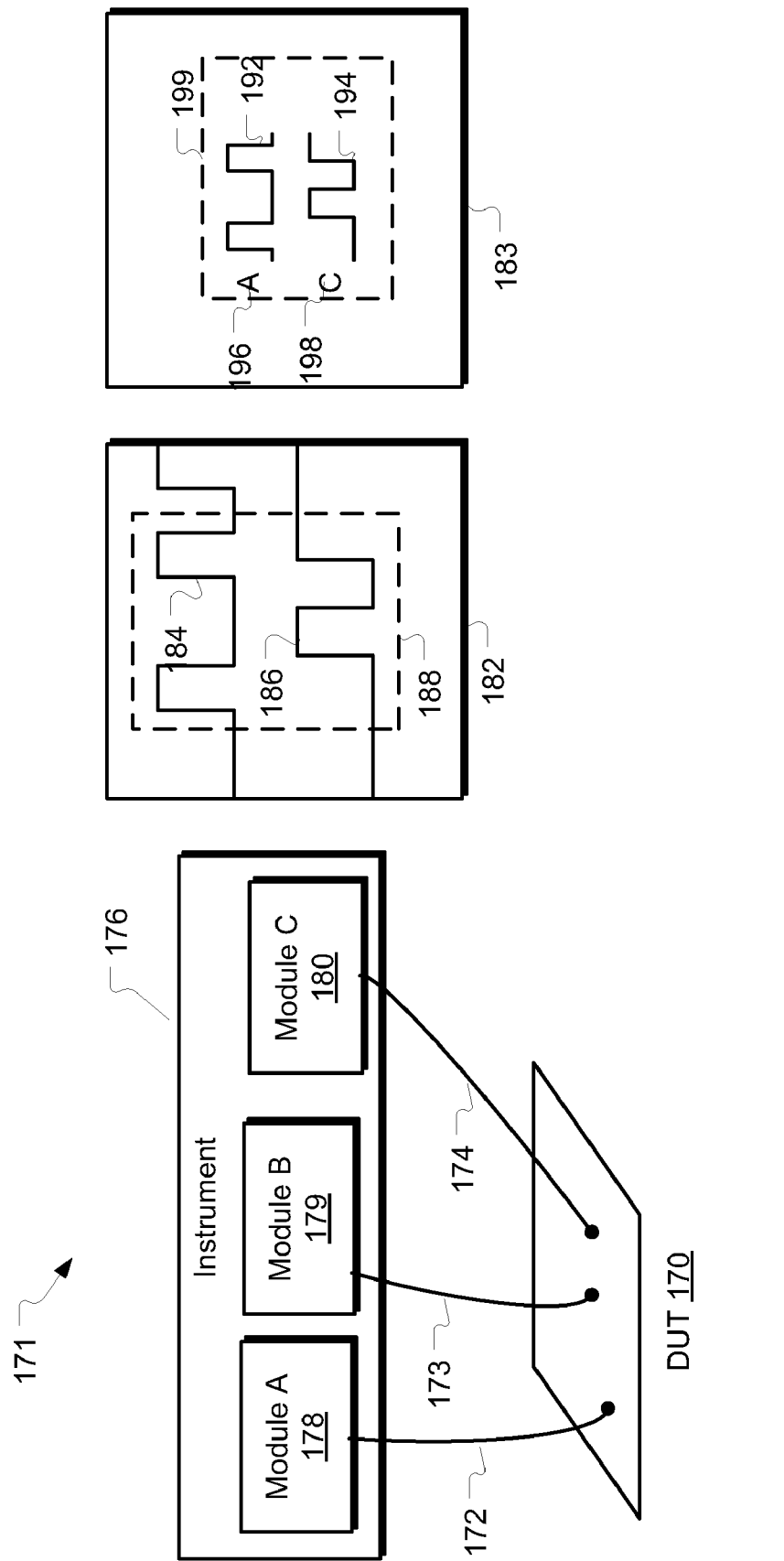
FIG. 4 is a diagram illustrating an example of how multiple sources of data are identified in an analysis sandbox.

FIG. 4 is a diagram illustrating an example of how multiple sources of data are identified in an analysis sandbox. In one example, an instrument 176 can be coupled to a device under test 170 (DUT) in test setup 171. Instrument 176 includes modules Module A 178, Module B 179, and Module C 180. Each of the modules is coupled to the DUT 170 through a corresponding probe 172, 173, or 174.

Data presentation 182 is an example of a data presentation of data acquired by instrument 176. Data presentation 182 includes two displayed signals, a first signal 184 acquired by Module A 178 and a second signal 186 acquired by Module C 180. A data selection 188 is illustrated in the data presentation 182 of data that was selected for the analysis sandbox 183. Analysis sandbox 183 presents the data selection 188 with data object 199. The dashed line in 199 illustrates the bounds of the data object 199. The dashed line can, but need not be part of the presentation of the data object 199 in the analysis sandbox 183. Data object 199 includes data symbols 192 and 194 representing the selected portions of the signals 184 and 186, respectively. Text 196 and text 198 indicate that the data object 199 is associated with Module A 178 and Module C 180. Thus, the data sources that contributed to the data object 199 are now parameters of the data object 199. In addition, since each data object can have multiple data sources, each individual data source of a data object can have its own separate identification. The data sources associated with a data object can be presented in the analysis sandbox along with the data object 199.

Although an indication of the data sources has been presented, it need not be. The illustration of the data sources in the data object 199 of FIG. 4 is intended to illustrate that the association exists and not to imply that the association must be illustrated.

In an embodiment, the data of the data object can be presented as a representation of the data object. For example, in FIG. 4, data symbols 192 and 194 are similar to the selected portions of signals 184 and 186 in the data presentation 182. Accordingly, the user can glance at data object 199 in the data presentation 183 and easily understand the underlying data associated with the data object. By maintaining the format of the data presentation, the user has a direct correlation between the selected desired data and the attributes of the analysis construct that correspond to that data.

Although the data as presented in the data presentation has been used as an example of the representation of the data object, that particular presentation need not be the representation of the data object. A different presentation of the data can be used, including presentations with more or less detail. In another example, a symbol associated with the data events can be used as the representation of the data object. A symbol can represent a data event such as a pulse without using the exact representation of the data. Thus, the presentation of the data of the data object can include presenting a different level of detail, presenting a symbol for the data, or the like.

Figure 5:
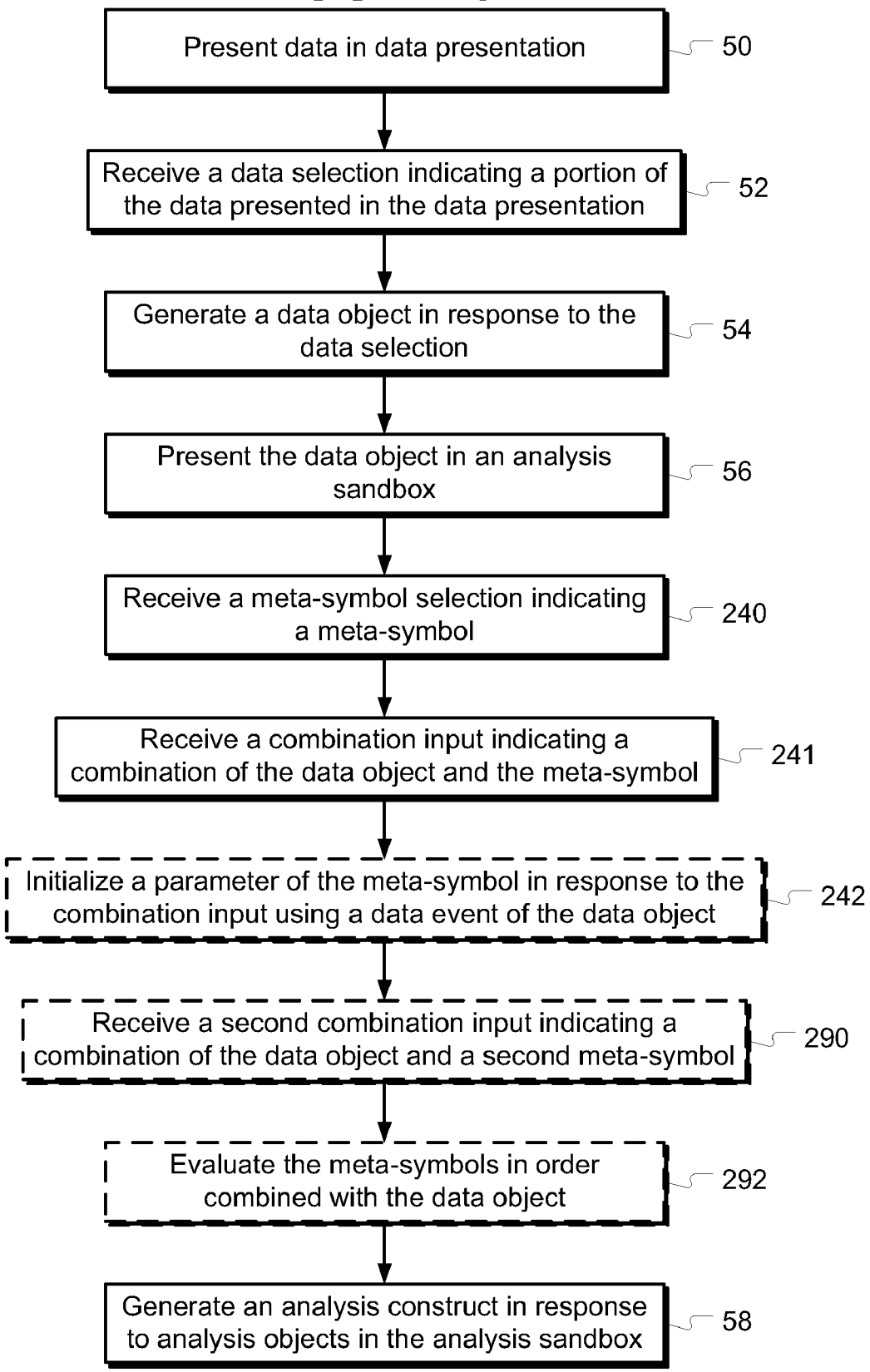
FIG. 5 is a flowchart illustrating how data objects and meta-symbols interact in the method of analyzing data of FIG. 1.

FIG. 5 is a flowchart illustrating how data objects and meta-symbols interact in the method of analyzing data of FIG. 1. In an embodiment, a meta-symbol selection is received in 240 indicating a meta-symbol. The meta-symbol selection is an input indicating a meta-symbol for the analysis sandbox. Similar to other selections described above, the meta-symbol selection can be any type of input.

The meta-symbol can provide a variety of contributions to the analysis sandbox. In one example, the meta-symbol can modify a data object. In 241, a combination input indicating a combination of the data object and the meta-symbol is received. The combination input associates the data object to the meta-symbol. The combination input can indicate the addition of the meta-symbol to the data object, the addition of the data object to the meta-symbol, or the like. As described with reference to FIG. 2, a time meta-symbol 104, an amplitude meta-symbol 106, and a loop symbol 108 can be added to a data object.

Figure 6:
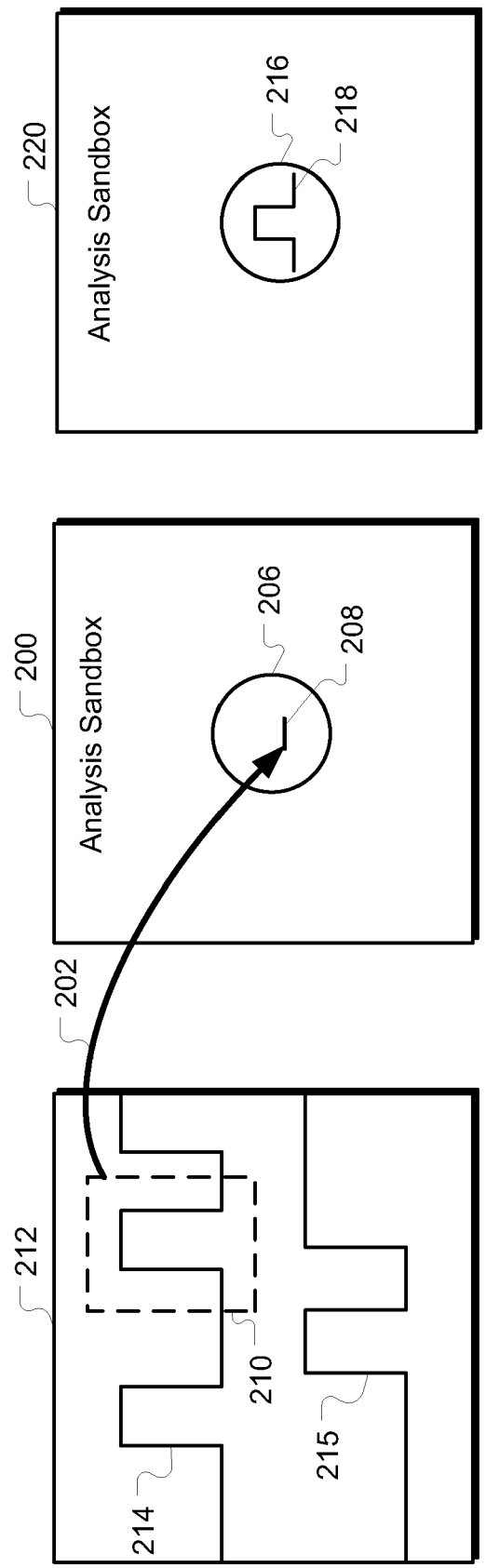
FIG. 6 is a diagram illustrating an example of adding a data object to a meta-symbol in an analysis sandbox.

FIG. 6 is a diagram illustrating an example of adding a data object to a meta-symbol in an analysis sandbox. In one example, the data object can be added as a parameter to the meta-symbol. Data presentation 212 includes a signal 214. A selection 210 is made on signal 214. Analysis sandbox 200 illustrates the contents of the analysis sandbox before the addition of a data object corresponding to the selection 210. A loop meta-symbol 206 is already in the analysis sandbox 200. Arrow 202 indicates the combination input adding the selected portion of the data 210 as a data object for a parameter 208 of the loop meta-symbol 206. In this example, the line of parameter 208 indicates that a parameter is available for this meta-symbol. Although a line has been illustrated as indicating a parameter, other indicators can be used. For example, a box, a dot, a character, an icon or the like can indicate a parameter. In addition, the parameter need not be indicated.

Analysis sandbox 220 illustrates the state of the analysis sandbox 200 after the combination input. Thus, a data object 218 is illustrated as a parameter of the loop meta-symbol 216. In this example, the resulting analysis construct can indicate finding a number of occurrences of the data object 218. When the number of occurrences is met, an appropriate response for the analysis type, such as triggering, annotating, searching, and filtering, can be generated.

Referring back to FIG. 5, an embodiment includes initializing a parameter of the meta-symbol in response to the combination input using a data event of the data object in 242. As described above, a meta-symbol can be added to a data object in the analysis sandbox. Such a meta-symbol can represent an analysis associated with the data symbol. In one example, the analysis can be a measurement of the data itself. In another example, the analysis can be of a data event associated with the data object. Regardless, some aspect of the data can be analyzed in response to the meta-symbol.

When used in data analysis, the analysis may need to be compared against a state, value, or the like, to determine how to proceed. For example, a user may be investigating glitches in the form of narrow pulse widths. Accordingly, the analysis can be a measurement of a pulse width. Thus, the value to compare the measurement is a width where values below a threshold are of interest. The user may have selected the data for the data object by selecting data that has the characteristics of interest. In this example, the user may have found a pulse having a width that the user considers a glitch. Accordingly, the parameters of the meta-symbol can be initialized from the data. In this example, the analysis represented by the meta-symbol is a comparison of a pulse with the width of the pulse in the original data.

Figure 7:
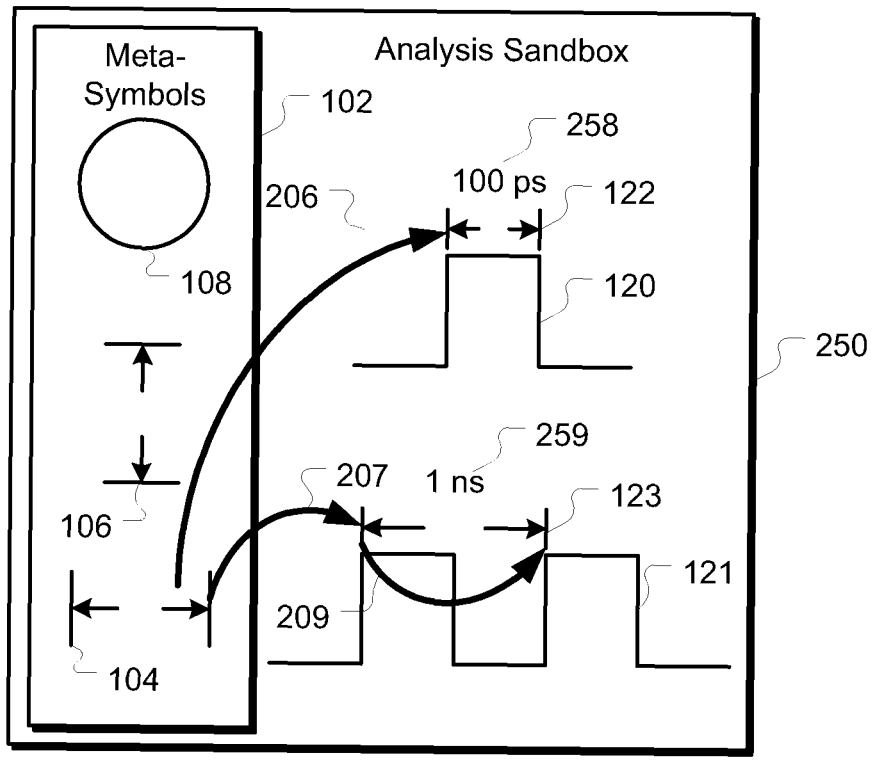
FIG. 7 is a diagram illustrating an example of how a meta-symbol is initialized in an analysis sandbox.

FIG. 7 is a diagram illustrating an example of how a meta-symbol is initialized in an analysis sandbox. The analysis sandbox 250 includes a meta-symbol frame 102. In the meta-symbol frame 102 are a loop meta-symbol 108, an amplitude meta-symbol 106, and a time meta-symbol 104. In this example, a data object 120 was already added to the analysis sandbox 250. Arrow 206 indicates the combination input to combine meta-symbol 104 with data object 120. The meta-symbol 122 corresponding to the added time meta-symbol 104 can be initialized using the data object 120. In this example, the pulse width of the pulse of data object 120 is 100 ps. Accordingly, the meta-symbol 122 is initialized with 100 ps.

The parameter of the meta-symbol indicating the time can now be presented. In this case, the 100 ps time is presented as annotation 258. As a result, the user can see the time selected for the meta-symbol for use in the analysis construct. Although the parameter is presented as annotation 258, the parameter need not be presented.

In addition, the user can manipulate the parameter to adjust the initialized value. For example, the user may not be able to find the pulse with the width of the glitch. The user may be able to find some other pulse on the same signal and use it to generate a data object focusing on a pulse. When the meta-symbol is added to this data object, it may be initialized with a value that does not interest the user. Accordingly, the user can select the meta-symbol, then edit the parameter to indicate the expected value of the width of the glitch.

A user can also make changes to a data object that affect the appearance, presentation, or other attributes of the meta-symbol. For example, the user can edit the parameter. Accordingly, the corresponding parameter of the meta-symbol can be adjusted in response. The presentation of the meta-symbol can be adjusted to reflect the changed parameter. Using the pulse with example above, the data object may have a handle, line, or other manipulatable interface to adjust the pulse width. The meta-symbol may be a measurement of the pulse width with arrows aligned with the edges of the pulse in the data object. By changing the pulse width on the data object, the meta-symbol can be correspondingly updated.

The same meta-symbol can have different meaning, depending on the context of the data object, the manner of the combination input, or the like. Data object 121 illustrates another application of the same time meta-symbol 104 described above. Arrow 207 indicates a first portion of a combination input indicating a start of the time meta-symbol 123. Arrow 209 indicates a second portion of the combination input indicating an end of the time meta-symbol 123. In this example, the time of interest is the time between the rising edges of the pulses of the data object 121. Although the time meta-symbol 104 alone has been used as an example of a meta-symbol having multiple uses, any other meta-symbol can similarly have different uses.

Figure 8:
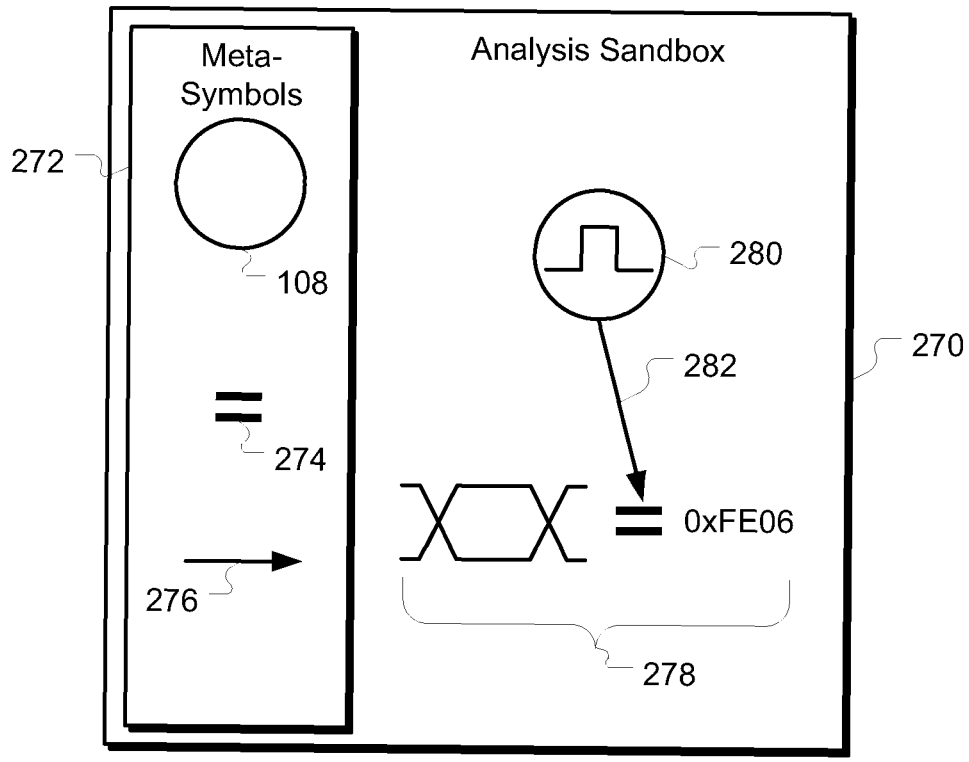
FIG. 8 is a diagram illustrating an example of how analysis objects are related in an analysis sandbox.

FIG. 8 is a diagram illustrating an example of how analysis objects are related in an analysis sandbox. In this example a meta-symbol is combined with the data objects to indicate a relationship between the data objects and/or meta-symbols. The analysis sandbox 270 includes a meta-symbol frame 272. The meta-symbol frame 272 includes a loop meta-symbol 108, an equal-to condition meta-symbol 274, and a flow control meta-symbol 276.

As described above, an analysis object can be a data object, a meta-symbol, a combination, or the like. Analysis objects 278 and 280 have been presented in the analysis sandbox 270. Meta-symbol 282 is a flow control meta-symbol 276 linking analysis object 280 and analysis object 278. In one example, the analysis construct created by the analysis sandbox 270 results in commands to find a number of pulses as indicated by analysis object 280. Meta-symbol 282 indicates that the next operation is to find a value of data equal to FE06 in hexadecimal.

A meta-symbol linking analysis objects can, but need not be limited to flow-control meta-symbols. Any meta-symbol attributes can be applied to multiple analysis objects. For example, the loop meta-symbol 108 could be applied to the analysis objects 278, 280, and 282, indicating a value of two loops. Thus, the condition established by analysis objects 278, 280, and 282 would need to occur twice to comply with the overall analysis construct. Similarly, time meta-symbol 104 could be used to define a time relationship between analysis objects 278 and 280. In the resulting analysis construct, the number of pulses must occur within a certain time period of when bus data is equal to FE06h.

Figure 9:
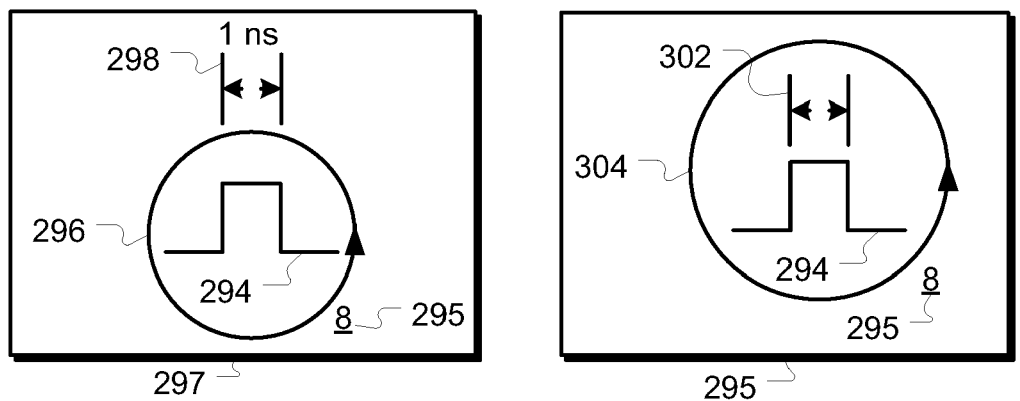
FIG. 9 is a diagram illustrating an example of how meta-symbols are added to a data object in an analysis sandbox.

Referring back to FIG. 5, in another embodiment, a second combination input is received in 290, indicating a combination of the data object and a second meta-symbol. In 292, the meta-symbols are evaluated in order combined with the data object. FIG. 9 is a diagram illustrating an example of how meta-symbols are added to a data object in an analysis sandbox. In analysis sandbox 297, loop meta-symbol 296 and time meta-symbol 298 modify data object 294. In this example, the resulting analysis construct would create instructions to find eight occurrences as indicated by the loop meta-symbol 298 of the pulse of data object 294 within 1 ns as indicated by time meta-symbol 298. In this example, the parameter 295 is set to eight indicating a count of eight for the loop meta-symbol 296. Thus, the eight pulses within the 1 ns time period would satisfy the analysis construct.

Similarly, analysis sandbox 295 includes the same data object 294 and the same types of meta-symbols with the same parameters. However, in analysis sandbox 295, the meta-symbols 302 and 304 were added to the data object 294 in the opposite order as compared with meta-symbols 296 and 298. Accordingly, the meta-symbols 302 and 304 can be evaluated in the opposite order. The resulting analysis construct can be instructions to find eight occurrences of a pulse 1 ns in width.

As a result, the order of the meta-symbols added to a data object can impact the creation of the analysis construct. Although added in a particular order, the order of the meta-symbols can be subsequently changed. For example, meta-symbol 296 and meta-symbol 298 can be reversed. Accordingly, the presentation can be adjusted to reflect the change in order, for example the order in analysis sandbox 295.

Figure 10:
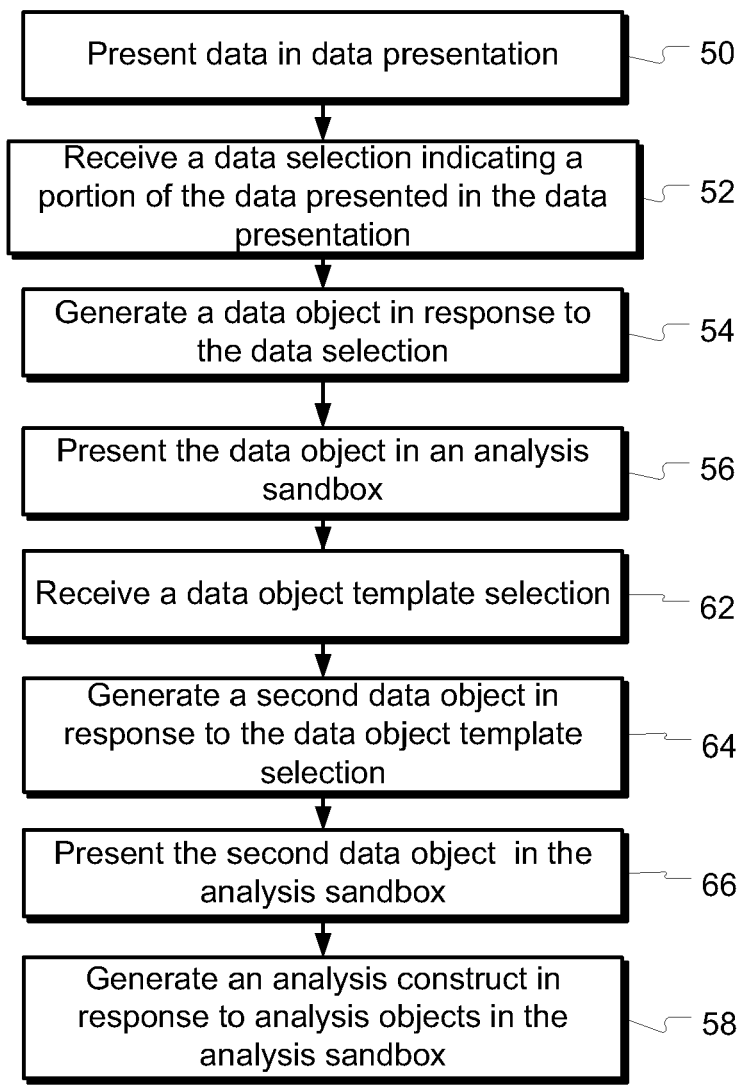
FIG. 10 is a flowchart illustrating an example of how a data object template is used in the method of analyzing of FIG. 1.

FIG. 10 is a flowchart illustrating an example of how a data object template is used in the method of analyzing of FIG. 1. An embodiment includes receiving a data object template selection in 62. As described above, a data object can be parameterized to include parameters representing aspects of the data used to generate the data object. In contrast, a data object template is a data object that does not have underlying data. The data object template includes parameters describing the data, but does not include the data.

This does not mean that a data object template can have no relationship to acquired data. In fact, the data object template can be generated from acquired data. For example, data can be acquired. Then a data object is generated from that data. The data object can be stored as a data object template, removing the reference to the actual data, yet retaining parameters describing the data. For example, as described above, a data object can be created from a rising edge of an analog signal with the rise time becoming a parameter of the data object. The actual data can be removed from the data object, leaving the rise time parameter as the data object template. Thus, the data object template, although created through actual data, has been abstracted from that data to create a generic representation of some data event.

A data object template selection is an input indicating a data object template. A data object can be generated in response to the data object template selection in 64. The data object template selection is an input indicating which data object template is to be presented in the analysis sandbox in 66. For example, the data object template selection can be a user input dragging an icon of the data object template to the analysis sandbox.

Figure 11:
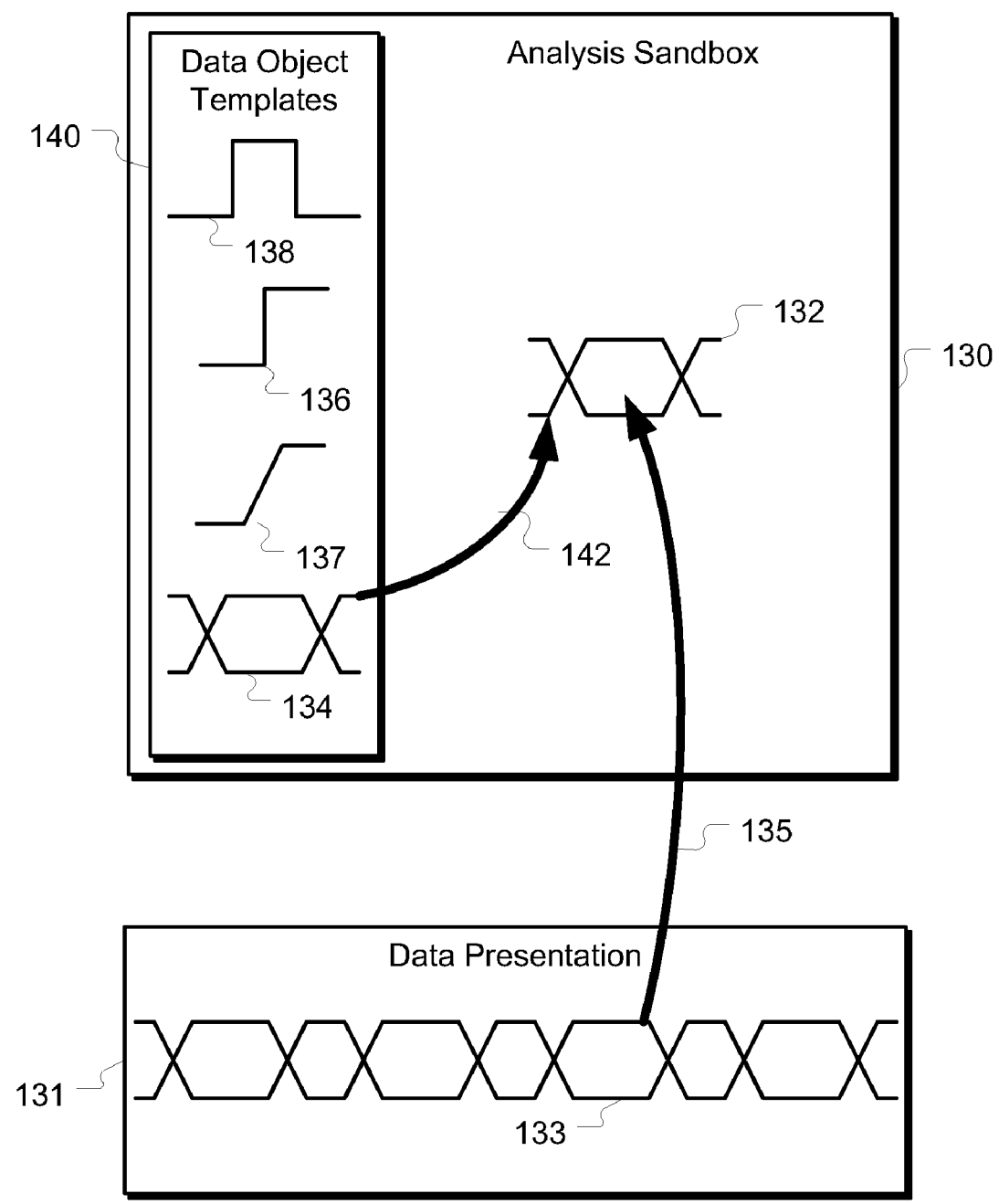
FIG. 11 is a diagram illustrating an example of a data object template in an analysis sandbox.

FIG. 11 is a diagram illustrating an example of a data object template in an analysis sandbox. The analysis sandbox 130 includes potential data object templates 140. For example, pulse data object template 138 can represent a pulse width, rise time data object template 136 can represent a rising edge, and bus value data object template 134 can represent a value on a bus. Arrow 142 indicates a data object template selection moving bus value data object template 134 to the analysis sandbox 130. As a result, data object 132 is created from the bus value data object template 134.

Since data need not be associated with the data object template, the resulting data object may not be sufficiently detailed to generate an analysis construct. The resulting data object may need additional information in order to contribute to an analysis construct. Depending on the data object template, a varying degree of additional information may be needed.

For example, with transition data object template 136, only a data source may be needed. Without an association of a data source with the data object, the resulting analysis construct may not indicate what data to analyze. In such a circumstance, the data to be analyzed can be the entire set of the data, a default set, a user defined set, or the like. In another example, with rise time data object template 137, a rise time may need to be entered. Such additional information can be added as parameters of the resulting data object.

Alternatively, a user can indicate the data associated with the data object. In the example of FIG. 11, data presentation 131 includes bus data 133. Arrow 135 indicates a user selection associating the data 133 with the data object 132 generated from the data object template 134. As a result, the analysis construct generated from the analysis sandbox now can indicate that the value of interest is a value on the data represented by bus data 133. In addition, the value of the selected data can be added to the data object 132. Thus, the user can, but need not explicitly indicate any modules, channels, instruments, or the like that contributed to the bus data 133. In this example, the user can select a bus value as the condition of interest and indicate what data to examine for that condition. Although a user could have manually entered the name, handle, or other identifier of the data 133, the user need not be concerned with such device specific references. The user can focus on the data and not the particulars of the test setup.

Figure 12:
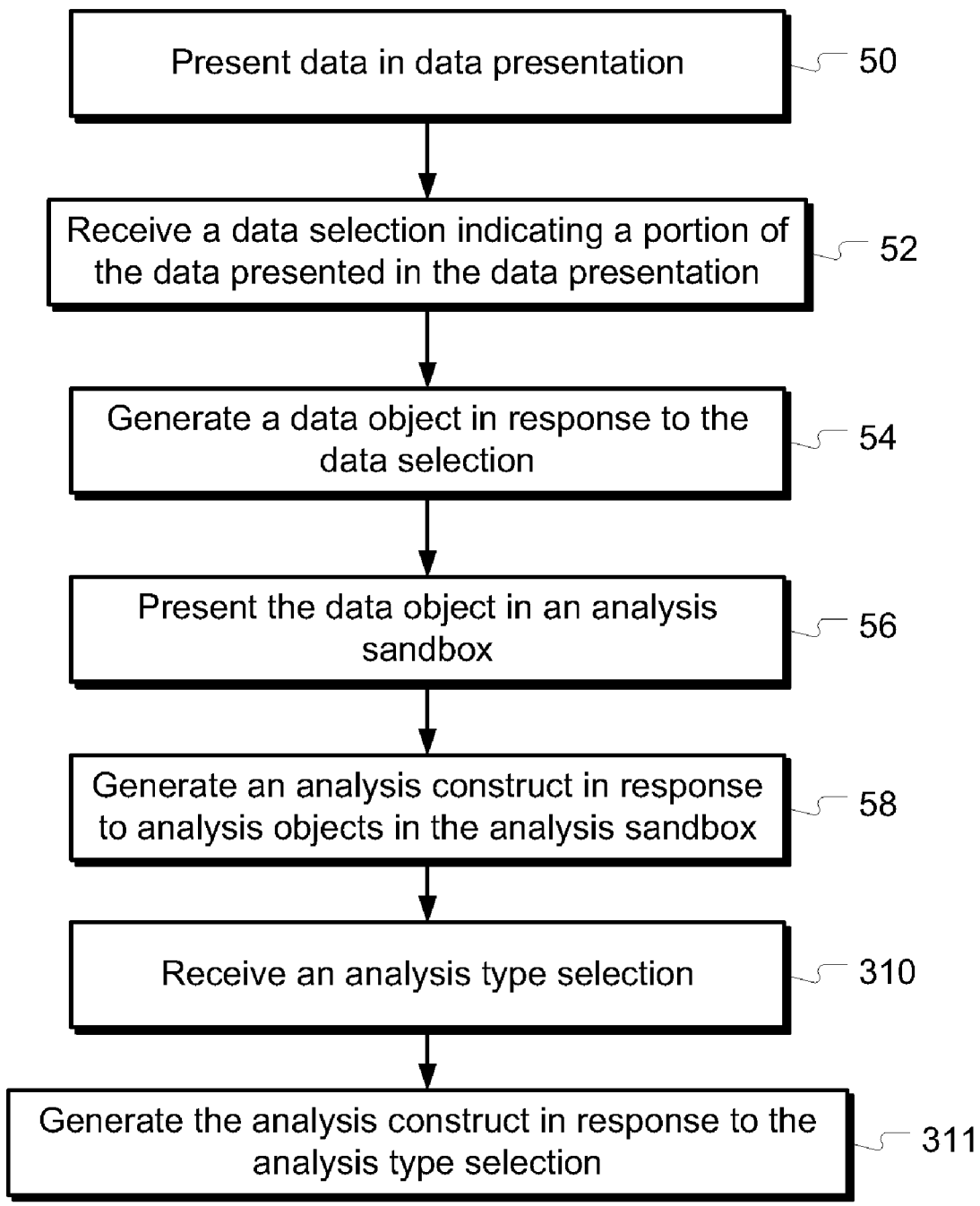
FIG. 12 is a flowchart illustrating an example of how an analysis type is used to generate an analysis construct in the method of analyzing data of FIG. 1.

FIG. 12 is a flowchart illustrating an example of how an analysis type is used to generate an analysis construct in the method of analyzing data of FIG. 1. In 310 an analysis type selection is received. An analysis type selection is an input indicating the type of analysis for the analysis construct. Similar to the other selections described above, the analysis type selection can be received in a variety of ways. As described above, filtering, triggering, searching, annotating, or the like are types of data analysis. When forming an analysis construct, the user can indicate type of analysis for the analysis construct.

Once the analysis type selection is made, the analysis construct can be generated in response in 311. As a result, an analysis construct can be created for the particular analysis type.

Between analysis types, the available meta-symbols can be different. For example, for a trigger analysis, available meta-symbols can include meta-symbols for starting acquisition, stopping acquisition, or the like. A filtering analysis can include meta-symbols for including matching data, excluding matching data, or the like. Other analysis types can have similar analysis type specific meta-symbols.

However, even though the meta-symbols can be type specific, such symbols can have similar associations. For example, a trigger meta-symbol can indicate starting acquisition. Similarly, a filtering meta-symbol can indicate presenting data after the occurrence. Both situations involve data after the occurrence. In such cases, the meta-symbols can be presented such that they are similar to convey the similar resulting data processing, yet different to convey the different analysis type. As a result, the meta-symbol grammar can have consistency between analysis types.

In an embodiment, a given analysis construct can be changed by changing the analysis type. In such circumstances, the common meta-symbols can remain the same. However, analysis type specific meta-symbols may not easily fit within the new analysis type. Accordingly, the analysis type specific meta-symbols can be translated. As described above, analysis types can have conceptually similar functionality, operations, indications, or the like. Such meta-symbols can be converted to the corresponding analysis type specific meta-symbol for the target analysis type. The criteria used to generate a given data analysis, for example, a filter, can be used for a different analysis type, for example, an annotation such as a search and replace.

Figure 13:
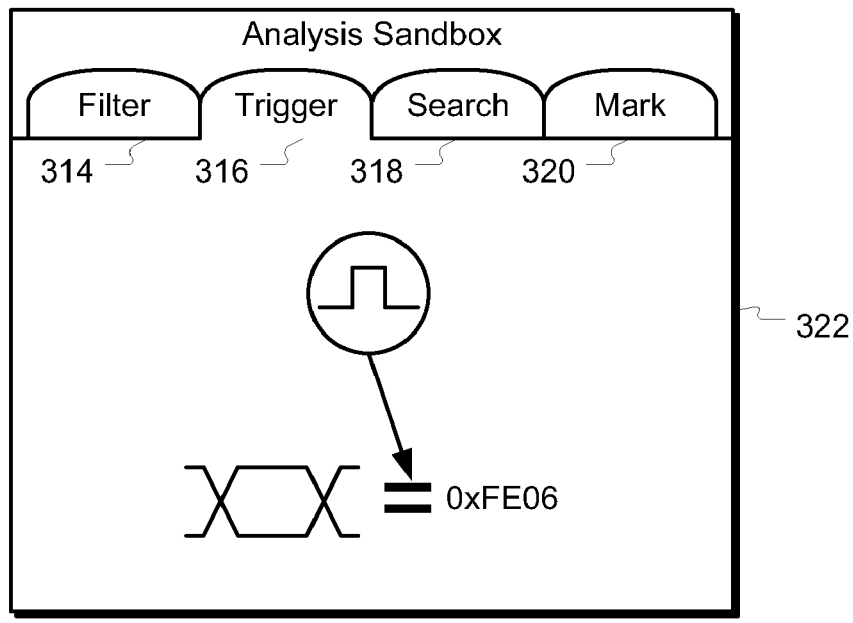
FIG. 13 is a diagram illustrating an example of user interface for indicating an analysis type in an analysis sandbox.

FIG. 13 is a diagram illustrating an example of user interface for indicating an analysis type in an analysis sandbox. The analysis sandbox 322 includes multiple tabs. Filter tab 314, trigger tab 316, search tab 318, and mark tab 320 indicate available analysis types. In this example, the analysis type can be indicated by selecting a tab. In this example, the trigger tab 316 has been selected, indicating that the analysis construct is for a trigger.

Selecting a different tab can have the effect of converting the analysis construct to the selected type. For example, the filter tab 314 can be selected. Accordingly, the meta-symbols in the analysis sandbox 322 can be converted to filter analysis meta-symbols as described above. Although using tabs has been described as an interface for selecting an analysis type, any interface can be used. For example, menus, settings, drop down boxes, or the like can be used to select the analysis type.

Furthermore, one analysis sandbox need not be limited to one analysis construct or one analysis type. Meta-symbols can describe analysis types or analysis type-specific actions. Accordingly, depending on the conditions, in the analysis construct, different data analyses can be performed. For example, on finding a particular packet header, a data acquisition can be stored while finding a signal with a particular rise time can cause the data presentation to be filtered. Any data analysis can have overlapping requirements, conditions, or the like and can simultaneously be described in a single analysis sandbox.

Figure 14:
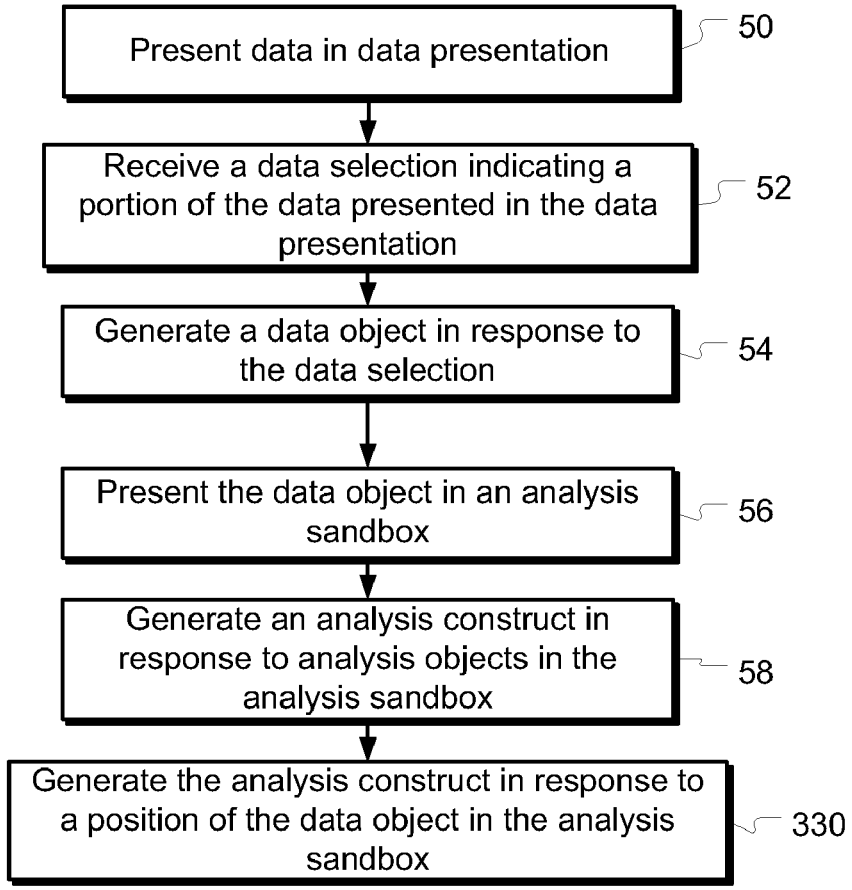
FIG. 14 is a flowchart illustrating an example of how a data object affects the analysis construct in the method of analyzing data of FIG. 1.

FIG. 14 is a flowchart illustrating an example of how a data object affects the analysis construct in the method of analyzing data of FIG. 1. As described above, data objects, meta-symbols, or the like can be added to an analysis sandbox. In an embodiment, when added to the analysis sandbox, the analysis objects can gain a position within the analysis sandbox.

For example, if the analysis sandbox is a two dimensional plane, a data object can gain a two dimensional position parameter from its placement on the two dimensional plane. Furthermore, when a subsequent data object or meta-symbol is added to the analysis sandbox, it can gain a position parameter. Since the analysis objects in the analysis sandbox each have positions relative to the analysis sandbox, the analysis objects have positions relative to each other.

In 330, the analysis construct is generated in response to a position of the data object in the analysis sandbox. In one example, the position of the data object in the analysis sandbox can contribute to the analysis construct. For example, a horizontal position in the analysis sandbox relative to the width of the analysis sandbox can indicate the data to be acquired in a trigger operation. If the data object is to the left side of the analysis sandbox, then data after the trigger defined by the data object will be stored. If the data object is to the right side of the analysis sandbox then data before the trigger defined by the data object will be stored. Any parameter of an analysis construct can be responsive to a position of the data object.

Figure 15:
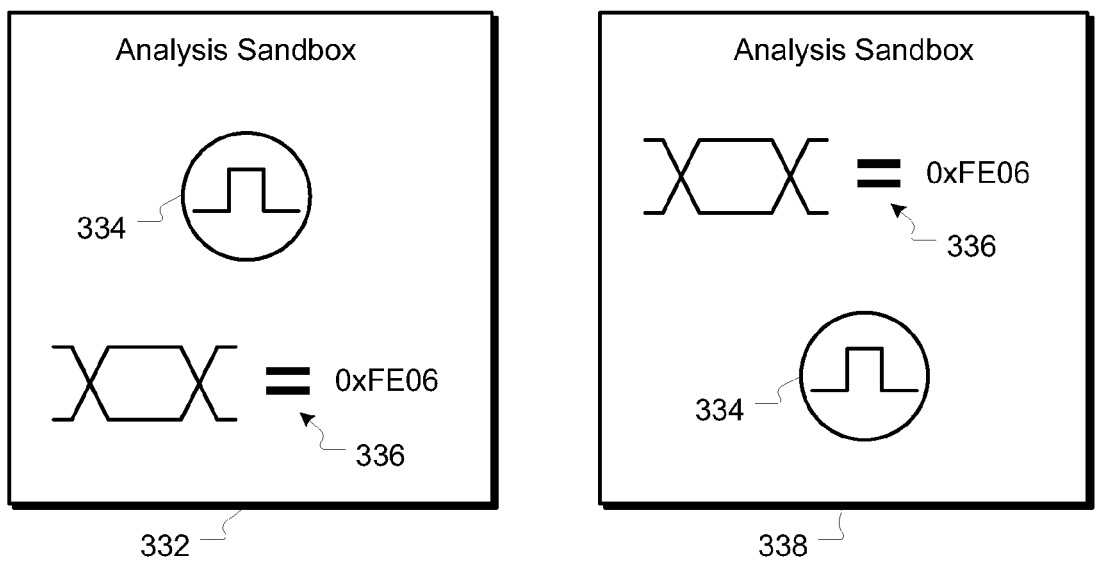
FIG. 15 is a diagram illustrating an example of positions of analysis objects in an analysis sandbox.

In another example, a relative position of a data object can influence how it is interpreted in forming the analysis construct. FIG. 15 is a diagram illustrating an example of positions of analysis objects in an analysis sandbox. Analysis sandbox 332 and analysis sandbox 338 contain the same analysis objects, although at different positions. Analysis object 334 can indicate a count of pulses. Analysis object 336 can indicate a value of FE06h on a bus.

In analysis sandbox 332, analysis object 334 appears above analysis object 336. This can mean find a count of pulses first, then find FE06h on the bus. In contrast, in analysis sandbox 338, analysis object 334 appears below analysis object 336. This can mean find a value of FE06h on a bus first, then find a count of pulses. In this example, the relative position of the analysis objects in the analysis sandbox can contribute to the ordering of the analysis construct.

Figure 16:
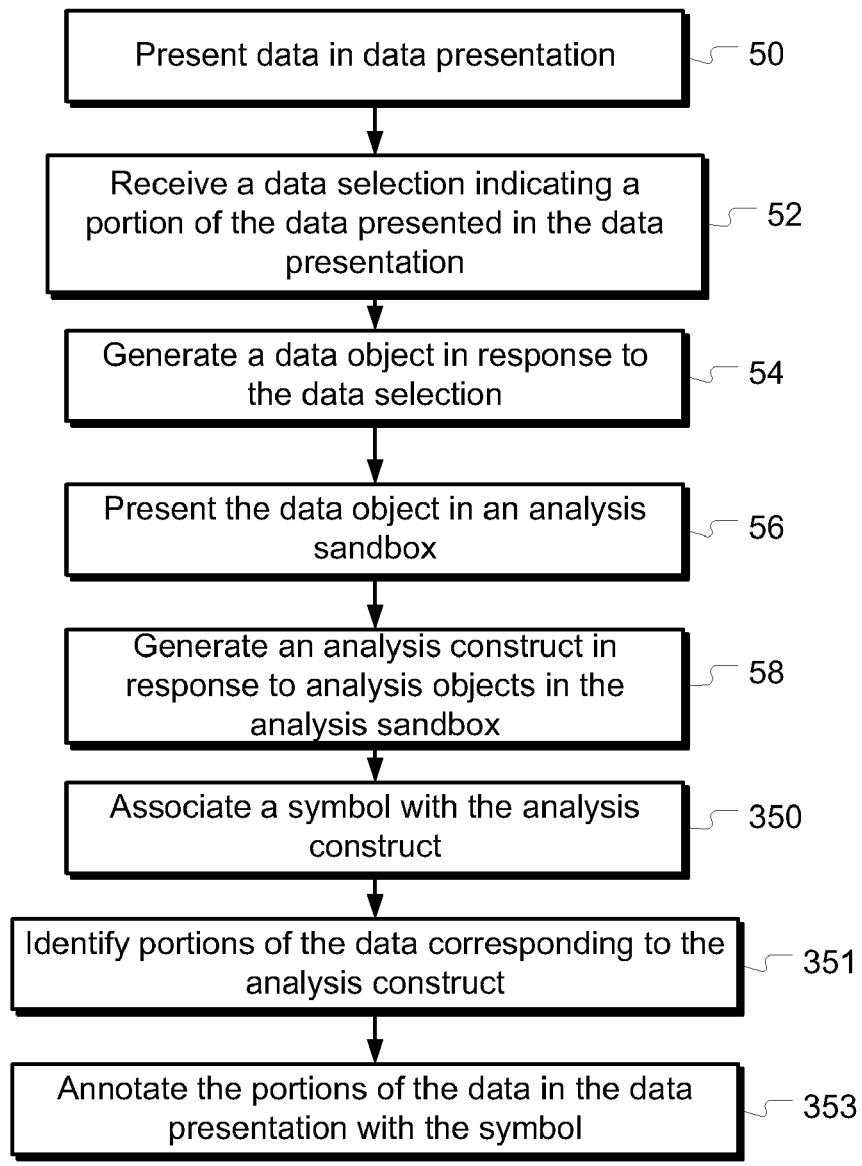
FIG. 16 is a flowchart illustrating an example of how data is presented by a symbol using an analysis construct in the method of analyzing data of FIG. 1.

FIG. 16 is a flowchart illustrating an example of how data is presented by a symbol using an analysis construct in the method of analyzing data of FIG. 1. As described above, annotation is an example of an analysis that can be performed with an analysis construct formed in the analysis sandbox. One example of annotation is replacement or substitution. A sequence or set of data can be replaced with something else.

In an embodiment, a set of data can be replaced with a symbol. Any matching sets within the data can be presented as the symbol. In 350, a symbol is associated with the analysis construct. The analysis construct can be in the analysis sandbox. A user can indicate a symbol to associate the analysis construct in the analysis sandbox.

Accordingly, when analyzing the data, portions of the data corresponding to the analysis construct can be identified in 351. These identified portions of the data can be annotated in the data presentation in 353 with the symbol. As a result, users can be presented with patterns of symbols more easily distinguishable than the underlying data presentation.

Annotation of the data can include a variety of changes. Annotation can include replacement, modification, superposition, or the like. For example, as described above, portions of the data can be replaced with a symbol. In another example, the symbol can be presented in the same location as the portion of the data.

Figure 17:
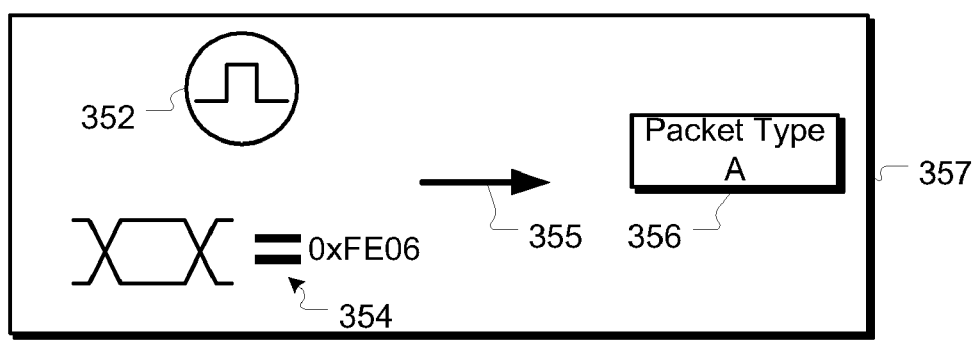
FIG. 17 is a diagram illustrating an example of a symbol associated with an analysis construct.

FIG. 17 is a diagram illustrating an example of a symbol associated with an analysis construct. In this example, analysis objects 352 and 354 in analysis sandbox 357 define a particular analysis construct. The user can indicate that this analysis construct is replaced with symbol 356 indicating that it is "Packet Type A". As a result, any time there is a sequence of pulses described by analysis object 352 and a bus value described by analysis object 356 that data presentation can be replaced by symbol 356. The illustration in FIG. 17 can represent analysis objects in an analysis sandbox. Accordingly, meta-symbol 355 can represent an annotation action.

Figure 18:
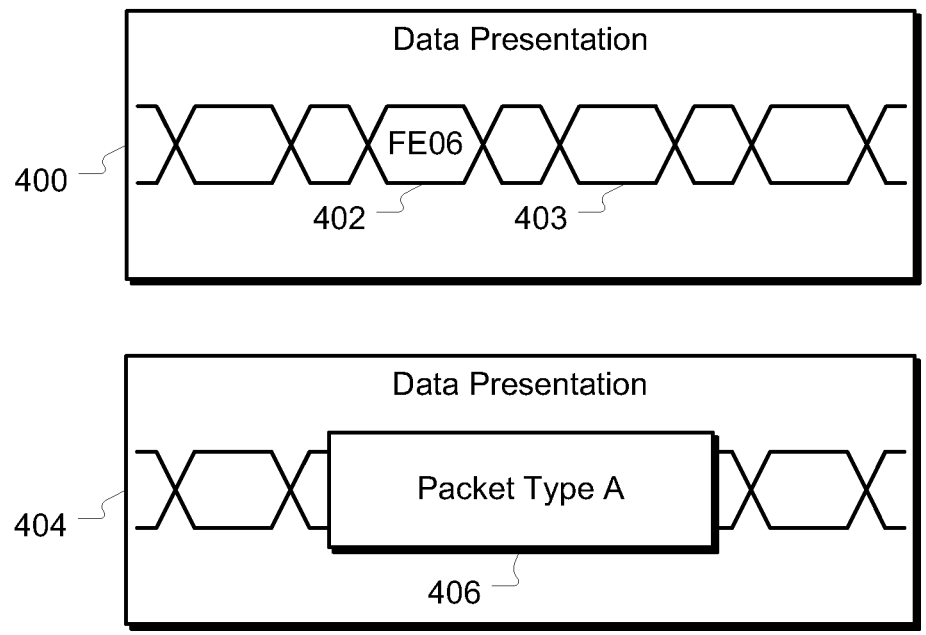
FIG. 18 is a diagram illustrating an example of how the symbol of FIG. 17 is used in a data presentation.

FIG. 18 is a diagram illustrating an example of how the symbol 356 of FIG. 17 is used in a data presentation. Data presentation 400 illustrates digital data 402 on a bus having the value of FE06h described with reference to FIG. 17. Note that the pulses that would satisfy analysis object 352 are not presented in data presentation 400 or 404. Data presentation 404 illustrates the same data, however, with a portion of it replaced with the symbol 406. As illustrated, the portion of the data that is replaced can, but need not be only the data that was identified. In data presentation 404, the data that was replaced included not only the value 402 but a portion of the subsequent data 403 as well.

Furthermore, the data that is replaced in the data presentation can, but need not retain the same relative dimensions of the replace data. In FIG. 18, the symbol 406 which replaced data from data presentation 400 retained the length of the data which it replaced. However, the symbol 406 could have been a different size than the replaced data. For example, the symbol 406 could have been narrower than the source data. The replaced data would occupy less space and a user could focus on the remaining data with reduced clutter from the replaced data.

Figure 19:
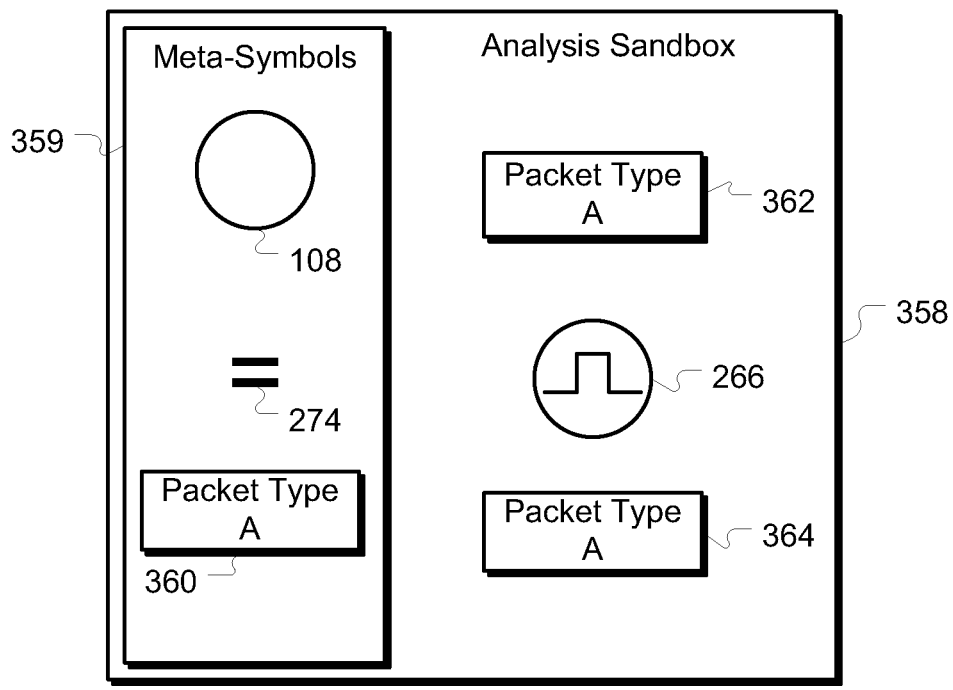
FIG. 19 is a diagram illustrating an example of how the symbol of FIG. 17 is used in an analysis sandbox.

FIG. 19 is a diagram illustrating an example of how the symbol of FIG. 17 is used in an analysis sandbox. Within the analysis sandbox, a particular set of analysis objects may be complex, occupy a large space in the analysis sandbox, or the like. These analysis objects can clutter the view of the analysis sandbox. Such a set of analysis objects can be replaced with a meta-symbol representing the set of analysis objects.

An analysis sandbox 358 includes a meta-symbol frame 359 listing meta-symbols. The loop meta-symbol 108 and the equal-to condition meta-symbol 274 are illustrated for reference. Meta-symbol 360 is the aggregate of the analysis objects 352 and 354 from FIG. 17. In the analysis sandbox 358, two instances of meta-symbol 360 have been placed. For example, the resulting analysis construct can be instructions to find packet type A, then find a count of pulses, then find another packet type A. As a result, the user need not have separate instances of the analysis objects 352 and 354 of FIG. 17 that defined packet type A.

As illustrated in FIGS. 18 and 19, similar symbols are used. In FIG. 18, a set of data is presented by symbol 406. In FIG. 19, a set of analysis objects are presented as meta-symbol 360. Although the functions in these examples are different the same symbol can be used to illustrate the underlying similarities. Accordingly, similar analysis constructs, sets of analysis objects, or the like can be represented by the same or similar symbols symbol.

Furthermore, once the data is presented as in the data presentation 404 of FIG. 18, the symbol 406 can be manipulated as any other data. That is, it can be placed into the analysis sandbox and presented as the symbol 406. This illustrates an aspect of a recursive nature of data object based data analysis. An annotation analysis can substitute a symbol for a sequence of data in a data presentation. Then that substituted data can be selected and added to the analysis sandbox for further refinement. The data presentation can be updated and the process repeated For example, a user can begin at a simple acquisition such as acquiring data until a buffer is full. From the acquired data, the user can select data for data objects and create a new data presentation. In the new data presentation, data can again be selected for the analysis sandbox to generate a new analysis construct or modify an existing analysis construct. Thus, a user can refine the analysis all the while remaining within the context of the data.

In an embodiment, a user can define symbolic protocol representations. As described above, a user can create an analysis construct that changes, replaces, or substitutes one representation of the data for another. The example described above replaced a sequence or set of the data with a symbol. This concept can be extended beyond replacement or substitution to another level of analysis. A user can define any number of associations of symbols and analysis constructs. As a result, a user can convert any part, including all of a data presentation into symbols.

One application of this is the definition of a protocol. A protocol has specific sequences, responses, states, or the like. Each can be defined by patterns in the data. As a result, data can be converted into symbols representing the various aspects of the protocol.

The groupings of the data into symbols can, but need not be limited to a defined protocol. In fact, users can define their own protocols, abstractions of the data that happen to help them analyze the data. In particular, a user can define any number of known conditions. As a result, any data not matching a condition would be an unknown or unexpected condition. As a result, the user can focus on the data that may not comply with their expectations, protocol, or the like.

Figure 20:
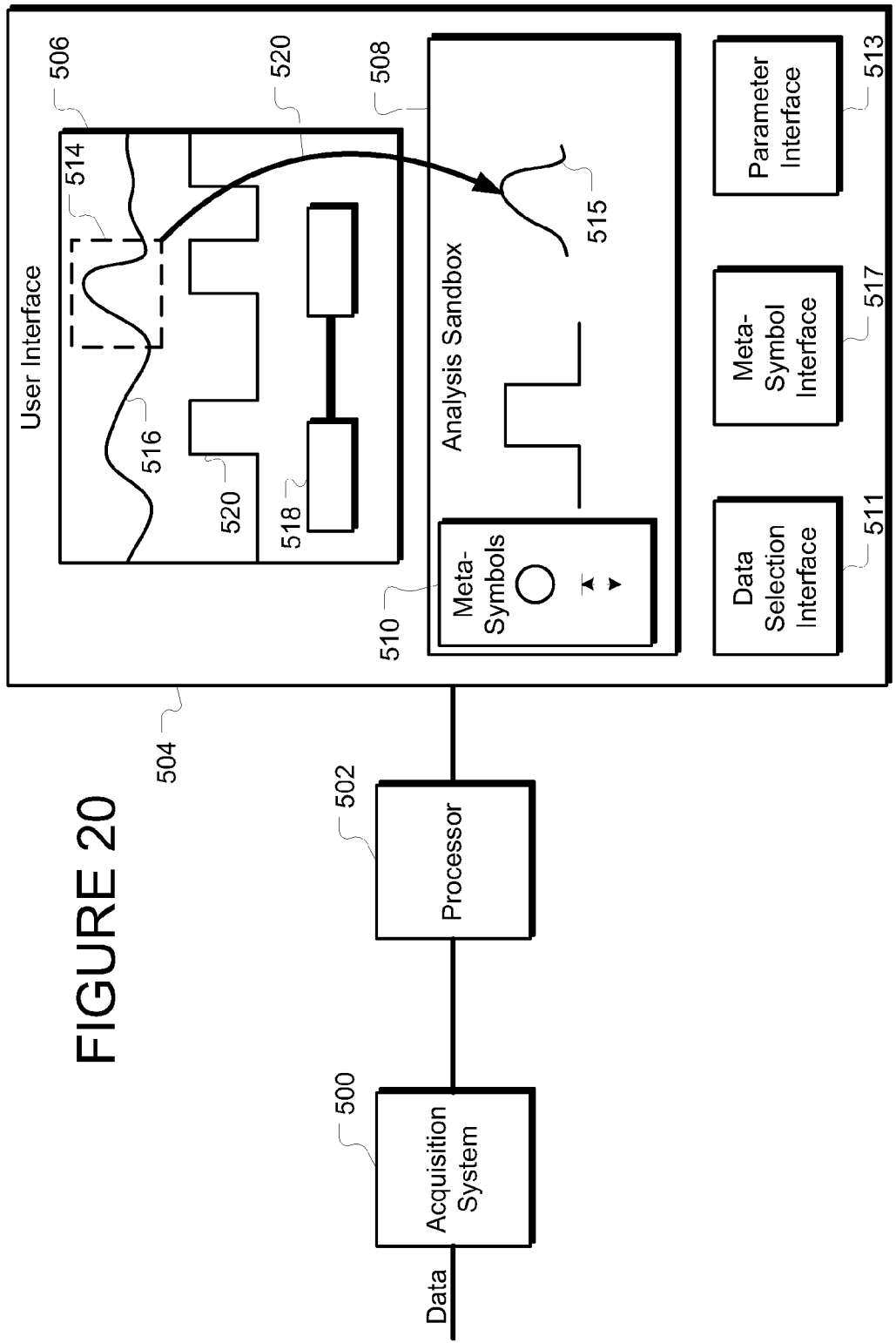
FIG. 20 is a block diagram illustrating a system for analyzing data according to an embodiment of the invention and an example of a user interface of such a system.

FIG. 20 is a block diagram illustrating a system for analyzing data with an example of a user interface according to an embodiment of the invention. In this embodiment, the system includes an acquisition system 500, a user interface 504 and a processor 502. The acquisition system 500 is configured to acquire data. Any type of data can be acquired by the acquisition system 500. For example, the acquisition system 500 can include digitizers to convert electrical signals into digitized data. The acquisition system 500 can also include microphones, accelerometers, or any other sensor, transducer, or the like that can convert a physical phenomenon into acquired data.

The acquisition system 500 can acquire data in any medium. For example, electrical signals, optical signals, audible signals, or the like can all be acquired by the acquisition system 500. The acquisition system 500 can acquire data from one or more sources. For example, the acquisition system 500 can be a single probe. In another example, the acquisition system 500 can be multiple modules each with multiple probes. Furthermore, the acquisition system 500 can be an interface for a storage system. For example, to acquire the data, the acquisition system 500 can read a file from the storage system. An interface for any storage system can be used. For example, the storage system can be a local storage system, a remote storage system, a network attached storage system, a distributed storage system, or the like.

The processor 502 can be a variety of devices. Such devices include general purpose processors, special purpose processors, application specific integrated circuits, programmable logic devices, distributed computing systems, or the like. In addition, the processor 502 may be any combination of such devices.

The processor 502 is configured to present the data from the acquisition system 500 through the user interface 504. The user interface 504 includes a data presentation 506 to present the data, and an analysis sandbox 508 to create an analysis construct to analyze the data in response to a data object from the data presentation 506.

The user interface 504 encompasses the devices, apparatuses, systems, or the like that handle interactions between the system and the user. Accordingly, the user interface 504 can be any variety of interfaces. The user interface 504 can include input devices such as knobs, dials, sliders, pointing devices, keyboards, keypad, touch screens, or the like. The user interface 504 can also include output devices such as displays, monitors, speakers, mechanical actuators, or the like. Furthermore, such input and output devices can, but need not exclusively be for input or output. For example, the touch screen can be both an input and output device. In another example, a network interface can both receive and transmit inputs and outputs from a user.

Although the user interface 504 includes the term "user," a user can, but need not be limited to a human being. For example, the user can be an automated process that is using the system. Although a data presentation has been described with reference to senses of a human being, the data presentation can be in a machine readable presentation. For example, the data presentation 506 need not be in a visual, tactile, or audible format, but can be presented in electronic signals or other format suitable for an automated process.

The data presentation 506 is configured to present the data. The implementation of the data presentation 506 can vary depending on the data acquired by the acquisition system 500. The data presentation can be a visual presentation of the data. For example, electrical signals can be presented as plots on a graph displayed on a monitor. The data presentation 506 can also be an audible presentation. For example, the data presentation 506 can be sounds presented through a speaker. Although a variety of media for the data presentation have been described, the data presentation can, but need not present the data in the same medium from which it was acquired.

The analysis sandbox 508 is configured to create an analysis construct to analyze the data in response to a data object from the data presentation 506. As described above, a user can select data in the data presentation 506 for a data object. The data object in the analysis sandbox can be used in a variety of ways to create an analysis construct. For example, it can contribute data events, data sources, or the like to the analysis construct.

Selection 514 represents a data selection in the data presentation 506 that was the source of data object 515. Accordingly, an analysis construct can be generated for the analysis sandbox 508 to analyze data presented in the data presentation 506.

In an embodiment, the processor 502 can be the sole controller of the user interface 504. For example, the processor 502 can receive an input from buttons, pointing devices, keyboards, or the like in the user interface 504 and control a display to present the data presentation 506. In another embodiment, each aspect of the user interface 504 can have its own processor. For example, data presentation 506, the analysis sandbox 508, the data selection interface 511, the meta-symbol interface 517, the parameter interface 513, and the entire user interface 504 can each have a dedicated processor. Any operation can be distributed across one or more processors in the system.

Figure 21:
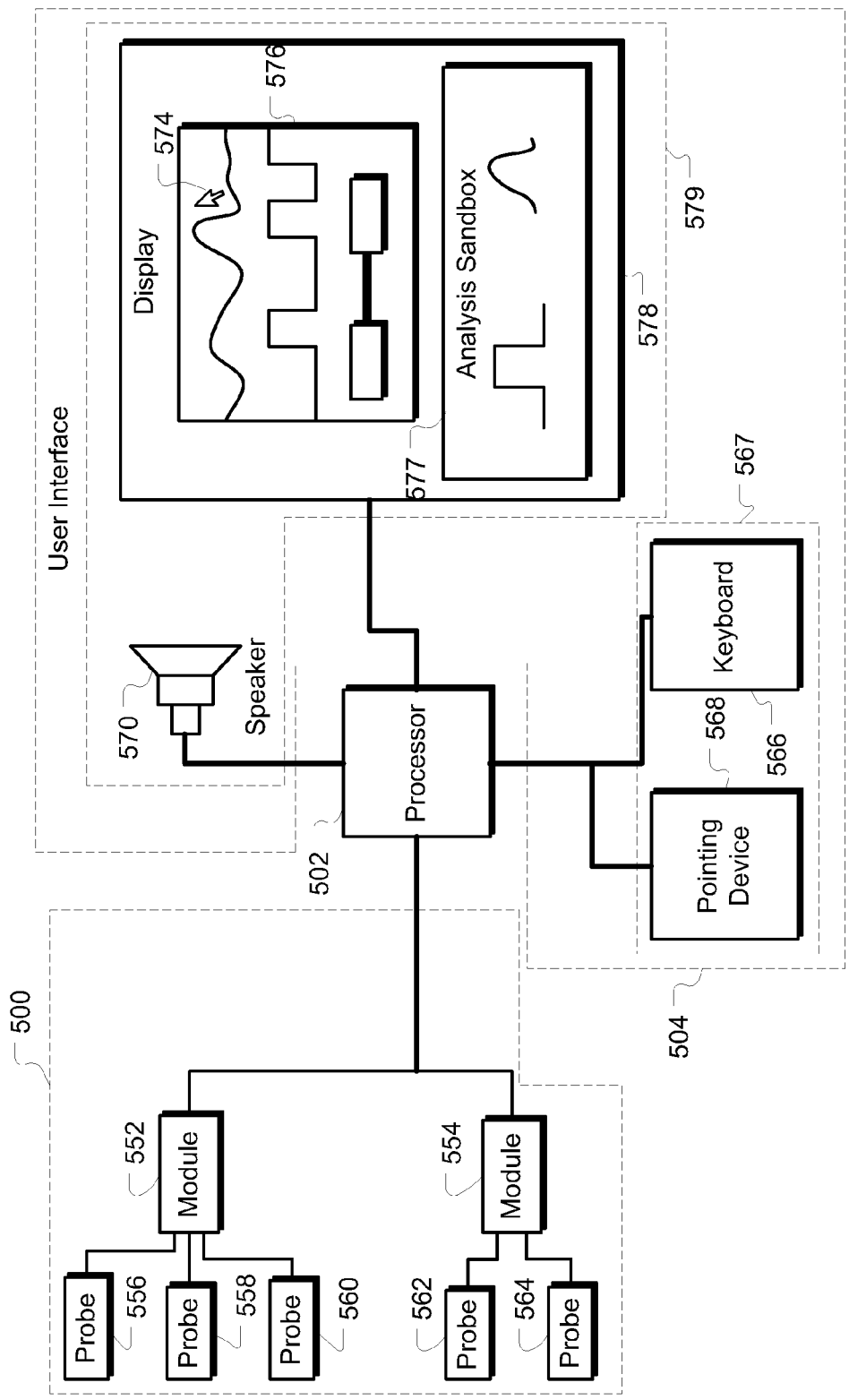
FIG. 21 is a block diagram illustrating examples of components of the system of FIG. 20.

FIG. 21 is a block diagram illustrating examples of components of the system of FIG. 20. In this embodiment, the acquisition system 500 includes modules 552 and 554. Each of the modules 552 and 554 has a number of probes for acquiring data. In this example, module 552 has probes 556, 558, and 560. Module 554 has probes 562, and 564. In one example, the modules 552 and 554 can be modules of a logic analyzer mainframe. The probes 556, 558, 560, 562, and 564 can be probes attached to the modules for acquiring data.

An example of the system in FIG. 20 is a test and measurement instrument. A test and measurement instrument can be any device, system, software application, apparatus, or the like that acquires data for present or future analysis and/or analyze such data. Examples of a test and measurement instrument include logic analyzers, spectrum analyzers, oscilloscopes, video analyzers, or the like.

In the embodiment illustrated in FIG. 21, the user interface 504 includes a pointing device 568, a keyboard 566, a speaker 570, and a display 578. The display 578 includes a data presentation 576 and an analysis sandbox 577. Thus, in this example, the data presentation 576 is a visual presentation. The display 574 includes a pointer 574. Through the pointing device 568 and the displayed pointer 574, the user can select data for the analysis sandbox 577. The user interface 504 includes input devices 567 and output devices 574. In this example, the pointing device 568 and the keyboard 567 are input devices 567. Similarly, display 578 and the speaker 570 are output devices 579.

An embodiment includes a data selection interface 511 to receive a data selection for generating the data object. Using FIG. 21 as an example, the data selection interface can include all or portions of the display 578 including the data presentation 576, the analysis sandbox 577 and the pointer 574. For example, the display 578 can provide visual feedback for the user's inputs, in particular, the selection of the data for a data object from the data presentation 576. In addition, the speaker 570 can provide audible feedback for the selection of the data. The data selection interface can include the pointing device 568 and the keyboard 566. The data selection interface 511 can include any portions of the user interface 504 that can allow some form of selection of data from the data presentation 576.

Although portions of the user interface 504 have been described as being part of the data selection interface, such portions of the user interface 504 can, but need not be used exclusively for the data selection interface. Any portion of the user interface 504 can be exclusive for a particular portion of the user interface, or can be shared between other interfaces of the user interface 504.

Referring back to FIG. 20, in an embodiment, the user interface 504 can further include a meta-symbol interface 517. The meta-symbol interface 517 is configured to provide a meta-symbol for the analysis sandbox 508. As described above, the meta-symbols can be used for a variety of purposes in the analysis sandbox 508. Accordingly, the meta-symbol interface 517 can receive user inputs to enable those uses. In addition, the meta-symbol interface 517 can provide feedback to the user. Similar to the data selection interface 511 described above, the meta-symbol interface 510 can include pointing device 568, keyboard 566, or display 578 as illustrated in FIG. 21, or any other portion of the user interface 504.

A meta-symbol frame 510 is illustrated with various meta-symbols. The meta-symbol frame 510 is an example of part of a meta-symbol interface 517. Although meta-symbol interface 510 has been illustrated in FIG. 20 as a frame including a few meta-symbols, meta-symbol interface 510 can include other implementations and interfaces beyond the analysis sandbox 510.

The processor 502 is configured to create the analysis construct in response to the meta-symbol. As described above, the meta-symbols can modify data objects, modify other analysis objects, control process flow, represent a variety of data independent actions, or the like. Accordingly, the processor 502 can use the meta-symbols in the analysis sandbox to create the analysis construct.

As described above, analysis objects such as meta-symbols and data objects can have parameters. Accordingly, in an embodiment, the user interface 504 can include a parameter interface 513 to adjust a parameter of the data object in the analysis sandbox 508. In addition, the parameter interface 513 can be further configured to adjust a parameter of a meta-symbol in the analysis sandbox 508.

Similar to the other portions of the user interface 504 described above, the parameter interface 513 can share portions of the user interface 504 and can have independent portions. For example, the parameter interface 513 can include pop-up menus, frames, or the like to expose the parameters of an analysis object to the user.

Although particular implementations of individual interfaces of the user interface 504 have been described, any of the described implementations can be used for any individual interface. For example, a pop-up menu has been described in reference to the parameter interface 513. Such a pop-up menu can be used in the meta-symbol interface 510.

Another embodiment includes a system for analyzing data including means for presenting data in a data presentation, means for receiving a data selection indicating a portion of the data presented in the data presentation, means for generating a data object in response to the data selection, means for presenting the data object in an analysis sandbox, and means for generating an analysis construct in response to the data object.

The means for presenting data in a data presentation includes any device that can convey the data to a user. The monitors, speakers, mechanical actuators, or the like described above as a data presentation of the user interface can be the means for presenting data. The means for receiving a data selection indicating a portion of the data presented in the data presentation can include any device that can receive user input. The pointing device, keyboard, mouse, touch screen, or the like described above are examples of the means for receiving a data selection. The means for generating a data object in response to the data selection and the means for generating an analysis construct can include any processor described above. The means for generating the data object and the means for generating the analysis construct can, but need not include the same processor.

The means for presenting the data object in an analysis sandbox can include any of the means for presenting data. However, in an embodiment, the means for presenting the data object and the means for presenting data can, but need not be the same.

Another embodiment includes means for receiving a data object template selection, means for generating a second data object in response to the data object template selection, and means for presenting the second data object in the analysis sandbox. The means for receiving a data object template selection includes any device that can receive user input. Similar to the means for receiving a data selection, the means for receiving a data object template selection can include the pointing device, keyboard, mouse, touch screen, or the like described above for example. The means for generating a second data object in response to the data object template selection can include the processor similar to the means for generating the data object described above. The means for presenting the second data object in the analysis sandbox can include the means for presenting the data object described above.

Another embodiment includes means for receiving a meta-symbol selection indicating a meta-symbol; and means for receiving a combination input indicating a combination of the data object and the meta-symbol. The means for receiving a meta-symbol selection and the means for receiving a combination input can include any device that can receive user input, similar to the means for receiving the data selection.

Another embodiment includes means for generating the analysis construct in response to a position of the data object in the analysis construct. The means for generating the analysis construct can include a processor as described above.

Although particular means have been described as being similar to other means, in a given embodiment, the similar means can but need not be the same implementations. For example, the means for receiving the data selection and the means for receiving a meta-symbol selection have been described above as being similar. However, in an embodiment, both means can share both a pointing device input, yet have separate feedback outputs.

Furthermore, an embodiment can include means for performing any of the above described operations. Examples of such means include the devices described above. Although the term device has been used to give examples of the means described above, device can include any system, apparatus, configuration, or the like.

Another embodiment includes an article of machine readable code embodied on a machine readable medium that when executed, causes the machine to perform any of the above described operations. As used here, a machine is any device that can execute code. Microprocessors, programmable logic devices, multiprocessor systems, digital signal processors, personal computers, or the like are all examples of such a machine.

Although particular embodiments have been described, it will be appreciated that the principles of the invention are not limited to those embodiments. Variations and modifications may be made without departing from the principles of the invention as set forth in the following claims.

The invention claimed is:

1. A method in a test and measurement instrument of analyzing data representing a physical phenomenon, comprising:
   presenting data representing the physical phenomenon in a data presentation;
   receiving a data selection indicating a portion of the data presented in the data presentation;
   generating a data object in response to the data selection;
   adding the data object to an analysis sandbox; and generating an analysis construct from the data object in response to analysis objects in the analysis sandbox.

2. The method of claim 1, further comprising:
   analyzing the data in response to the analysis construct.

3. The method of claim 1, further comprising:
   receiving a data object template selection; and
   generating a second data object in response to the data object template selection; and
   presenting the second data object in the analysis sandbox.

4. The method of claim 1, further comprising:
   identifying a data event in the portion of the data; and
   adding a parameter to the data object for the identified data event.

5. The method of claim 1, further comprising:
   identifying any data sources associated with the data object; and
   adding a parameter to the data object for any identified data sources.

6. The method of claim 1, further comprising:
   generating analysis parameters for a plurality of data sources from the analysis construct.

7. The method of claim 1, further comprising:
   presenting the data of the data object as a representation of the data object.

8. The method of claim 1, further comprising:
   receiving a meta-symbol selection indicating a meta-symbol; and
   receiving a combination input indicating a combination of the data object and the meta-symbol.

9. The method of claim 8, further comprising:
   initializing a parameter of the meta-symbol in response to the combination input using a data event of the data object.

10. The method of claim 9, further comprising:
    receiving a second combination input indicating a combination of the data object and a second meta-symbol; and
    evaluating the meta-symbols in order combined with the data object.

11. The method of claim 1, further comprising:
    receiving an analysis type selection; and
    generating the analysis construct in response to the analysis type selection.

12. The method of claim 1, further comprising:
    generating the analysis construct in response to a position of the data object in the analysis construct.

13. The method of claim 1, further comprising:
    associating a symbol with the analysis construct;
    identifying portions of the data corresponding to the analysis construct; and
    presenting the identified portions of the data as the symbol.

14. A system in a test and measurement instrument for analyzing data representing a physical phenomenon, comprising:
    an acquisition system to acquire data representing a signal from a device under test, the data representing the physical phenomenon;
    a user interface; and
    a processor to present the data through the user interface;
    wherein the user interface includes:
       a data presentation to present the data; and
       an analysis sandbox to create an analysis construct to analyze the data in response to a data object representing a selected portion of the data in the data presentation.

15. The system of claim 14, in which the user interface further comprises:
    a data selection interface to receive a data selection representing the selected portion for generating the data object.

16. The system of claim 14, in which the user interface further comprises:
    a meta-symbol interface to provide a meta-symbol for the analysis sandbox;
    wherein the processor is configured to create the analysis construct in response to the meta-symbol.

17. The system of claim 14, in which the user interface further comprises:
    a parameter interface to adjust a parameter of the data object in the analysis sandbox.

18. The system of claim 17, in which the user interface is further configured to adjust a parameter of the meta-symbol in the analysis sandbox.

19. A system in a test and measurement instrument for analyzing data representing a physical phenomenon, comprising:
    means for presenting the data representing the physical phenomenon in a data presentation;
    means for receiving a data selection indicating a portion of the data presented in the data presentation;
    means for generating a data object in response to the data selection;

means for adding the data object to an analysis sandbox; and means for generating an analysis construct in response to the data object.

20. The system of claim 19, further comprising:

means for receiving a data object template selection;

means for generating a second data object in response to the data object template selection; and means for presenting the second data object in the analysis sandbox.

21. The system of claim 19, further comprising:

means for receiving a meta-symbol selection indicating a meta-symbol; and means for receiving a combination input indicating a combination of the data object and the meta-symbol.

22. The system of claim 19, further comprising:

means for generating the analysis construct in response to a position of the data object in the analysis construct.

23. A test and measurement instrument, comprising:

a transducer to convert a physical phenomenon to an electrical signal;

a processor to receive the electrical signal;

a display to present a representation of the physical phenomenon and also display an analysis sandbox in response to the processor; and a user interface to receive a user input indicating a selected portion of the representation of the physical phenomenon for adding the selected portion of the representation of the physical phenomenon to the analysis sandbox;

in which the processor is configured to generate an analysis construct in response to the selected portion of the representation of the physical phenomenon in the analysis sandbox.

24. A method of operating a test and measurement instrument including a transducer, a processor, a display, and a user interface, the method comprising:

receiving a signal representing a physical phenomenon through the transducer;

processing the signal into a representation of the physical phenomenon;

presenting the representation of the physical phenomenon on the display;

presenting an analysis sandbox on the display;

receiving a user input through the user interface indicating a portion of the representation of the physical phenomenon for adding the portion of the representation of the physical phenomenon to the analysis sandbox; and creating an analysis construct in response to a portion of the representation of the physical phenomenon in the analysis sandbox.

* * * * *